US012568822B2

(12) United States Patent
Noh et al.

(10) Patent No.: US 12,568,822 B2
(45) Date of Patent: Mar. 3, 2026

(54) SEMICONDUCTOR MODULE INCLUDING A CLIP STRUCTURE

(71) Applicant: SAMSUNG ELECTRONICS CO., LTD., Suwon-si (KR)

(72) Inventors: Hyunggyun Noh, Suwon-si (KR); Sangwoo Pae, Suwon-si (KR); Jinsoo Bae, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 687 days.

(21) Appl. No.: 17/813,417

(22) Filed: Jul. 19, 2022

(65) Prior Publication Data

US 2023/0215779 A1     Jul. 6, 2023

(30) Foreign Application Priority Data

Dec. 30, 2021     (KR) ......................... 10-2021-0193230

(51) Int. Cl.
H05K 7/20 (2006.01)
H01L 23/44 (2006.01)
(Continued)

(52) U.S. Cl.
CPC ............ H01L 23/44 (2013.01); H01L 23/473 (2013.01); H01L 25/072 (2013.01); H05K 7/203 (2013.01)

(58) Field of Classification Search
CPC ..... H01L 23/44; H01L 23/473; H01L 25/072; H01L 25/0652; H01L 25/0655;
(Continued)

(56) References Cited

U.S. PATENT DOCUMENTS 4,730,665 A     3/1988  Cutchaw
5,514,906 A  *  5/1996  Love ..................... H01L 23/473
257/E23.098
(Continued)

FOREIGN PATENT DOCUMENTS

CN     102510709 B     3/2015
CN     111863740 A     10/2020
(Continued)

OTHER PUBLICATIONS

Raza, M. A., et al. "Effect of boron nitride addition on properties of vapour grown carbon nanofiber/rubbery epoxy composites for thermal interface applications." Composites Science and Technology 120 (2015): 9-16 (Year: 2015).*

*Primary Examiner* — Norman D Richards
*Assistant Examiner* — Ethan Edward Cutler
(74) *Attorney, Agent, or Firm* — Wolf, Greenfield & Sacks, P.C.

(57)     ABSTRACT

Disclosed is a semiconductor module comprising a module substrate having a top surface and a bottom surface that are opposite to each other, a plurality of semiconductor packages on the top surface of the module substrate and arranged in a first direction parallel to the top surface of the module substrate, and a clip structure on the top surface of the module substrate and spaced apart from the plurality of semiconductor packages in the first direction. The clip structure includes a body part on the top surface of the module substrate and spaced apart from the plurality of semiconductor packages in the first direction, and a connection part that extends from the body part across a lateral surface of the module substrate onto the bottom surface of the module substrate.

18 Claims, 18 Drawing Sheets

1

(51) Int. Cl.
 *H01L 23/473* (2006.01)
 *H01L 25/07* (2006.01)

(58) Field of Classification Search
 CPC ....... H01L 25/16; H01L 25/18; H01L 25/105;
 H01L 23/4334; H01L 23/427; H01L
 25/071; H05K 7/203
 See application file for complete search history.

(56) References Cited

U.S. PATENT DOCUMENTS

| | | | |
|---|---|---|---|
| 7,911,792 B2 | 3/2011 | Liang et al. | |
| 9,328,964 B2 | 5/2016 | Shelnutt et al. | |
| 10,020,242 B2 | 7/2018 | Katsumata et al. | |
| 10,080,308 B2 | 9/2018 | Hirai et al. | |
| 2017/0339798 A1* | 11/2017 | Wang ................... | H05K 7/1401 |
| 2018/0090417 A1* | 3/2018 | Gutala ................ | H01L 21/4882 |
| 2020/0235083 A1* | 7/2020 | Kwon ..................... | H01L 23/36 |

FOREIGN PATENT DOCUMENTS

| | | | |
|---|---|---|---|
| JP | 2019175971 A | 10/2019 | |
| KR | 20200090093 A | 7/2020 | |
| WO | 2014132085 A1 | 9/2014 | |

* cited by examiner

Top View 0°

Side View 90°

Bottom View 180°

Side View 270°

Top View 0°

Side View 90°

Bottom View 180°

Side View 270°

Top View 0°

Side View 90°

Bottom View 180°

Side View 270°

SEMICONDUCTOR MODULE INCLUDING A CLIP STRUCTURE

CROSS-REFERENCE TO RELATED APPLICATION

This U.S. nonprovisional application claims priority under 35 U.S.C § 119 to Korean Patent Application No. 10-2021-0193230 filed on Dec. 30, 2021 in the Korean Intellectual Property Office, the disclosure of which is hereby incorporated by reference in its entirety.

BACKGROUND

The present inventive concepts relate to a semiconductor module, and more particularly, to a semiconductor module including memory packages.

A data center is increasingly utilized due to explosive growth of internet, artificial intelligence, cloud computing, and high performance computing (HPC), and immersion cooling is utilized to effectively cool computing hardware included in the data center. The immersion cooling is a cooling practice by which computing hardware is submerged in a non-conductive liquid, and may reduce the need for cooling components such as thermal interface material, heat sinks, and/or fans. The immersion cooling is classified into single-phase immersion cooling and two-phase immersion cooling. As regards the two-phase immersion cooling, heat generated from computing hardware may cause a coolant to change from its liquid state into a gaseous state, which may result in the occurrence of vapor. The two-phase immersion cooling may achieve effective cooling compared to the single-phase immersion cooling, but vapor produced during cooling may problematically deteriorate reliability of semiconductor modules.

SUMMARY

Some embodiments of the present inventive concepts provide a semiconductor module capable of preventing vapor from being trapped and easily transferring heat in two-phase immersion cooling.

Some embodiments of the present inventive concepts provide a semiconductor module with increased reliability.

According to some embodiments of the present inventive concepts, a semiconductor module may include a module substrate having a top surface and a bottom surface that are opposite to each other, a plurality of semiconductor packages on the top surface of the module substrate and arranged in a first direction parallel to the top surface of the module substrate, and a clip structure on the top surface of the module substrate and spaced apart from the plurality of semiconductor packages in the first direction. The clip structure may include a body part on the top surface of the module substrate and spaced apart from the plurality of semiconductor packages in the first direction, and a connection part that extends from the body part across a lateral surface of the module substrate onto the bottom surface of the module substrate.

According to some embodiments of the present inventive concepts, a semiconductor module may include a module substrate having a top surface and a bottom surface that are opposite to each other, the module substrate having a first side and a second side that extend in a first direction and are opposite to each other, and a third side and a fourth side that extend in a second direction and are opposite to each other, the first direction and second direction are parallel to the top surface of the module substrate and intersect each other, a plurality of semiconductor packages on the top surface of the module substrate and arranged in the first direction, a plurality of tabs on the top surface of the module substrate, adjacent to the first side, and arranged in the first direction; and a clip structure on the top surface of the module substrate and spaced apart from the plurality of semiconductor packages and the plurality of tabs in the first direction. The clip structure may include a body part on the top surface of the module substrate, the body part extending in the second direction between an outermost one of the plurality of semiconductor packages and the third side of the module substrate; and a connection part adjacent to the second side of the module substrate, the connection part extending from the body part across a lateral surface of the module substrate onto the bottom surface of the module substrate.

According to some embodiments of the present inventive concepts, a semiconductor module includes a module substrate having a top surface and a bottom surface that are opposite to each other, a plurality of semiconductor packages on the top surface of the module substrate, and a clip structure on the top surface of the module substrate and spaced apart from the plurality of semiconductor packages in a first direction. The clip structure includes a body part on the top surface of the module substrate and spaced apart from the plurality of semiconductor packages in the first direction, and a connection part that extends from the body part onto the bottom surface of the module substrate. The body part includes a curved surface remote from the plurality of semiconductor packages.

BRIEF DESCRIPTION OF THE DRAWINGS

FIG. 1A illustrates a plan view showing a semiconductor module according to some embodiments of the present inventive concepts.

FIG. 1B illustrates a perspective view showing a first side of the semiconductor module depicted in FIG. 1A.

FIG. 1C illustrates a perspective view showing a second side of the semiconductor module depicted in FIG. 1A.

FIG. 12A illustrates a plan view showing a semiconductor module according to some embodiments of the present inventive concepts.

FIG. 12B illustrates a perspective view showing a first side of the semiconductor module depicted in FIG. 12A.

FIG. 12C illustrates a perspective view showing a second side of the semiconductor module depicted in FIG. 12A.

FIG. 18A illustrates a plan view showing a semiconductor module according to some embodiments of the present inventive concepts.

FIG. 18B illustrates a perspective view showing a first side of the semiconductor module depicted in FIG. 18A.

FIG. 18C illustrates a perspective view showing a second side of the semiconductor module depicted in FIG. 18A.

DETAILED DESCRIPTION

The following will now describe in detail some embodiments of the present inventive concepts with reference to the accompanying drawings.

Figures 1A, 1B, 1C:
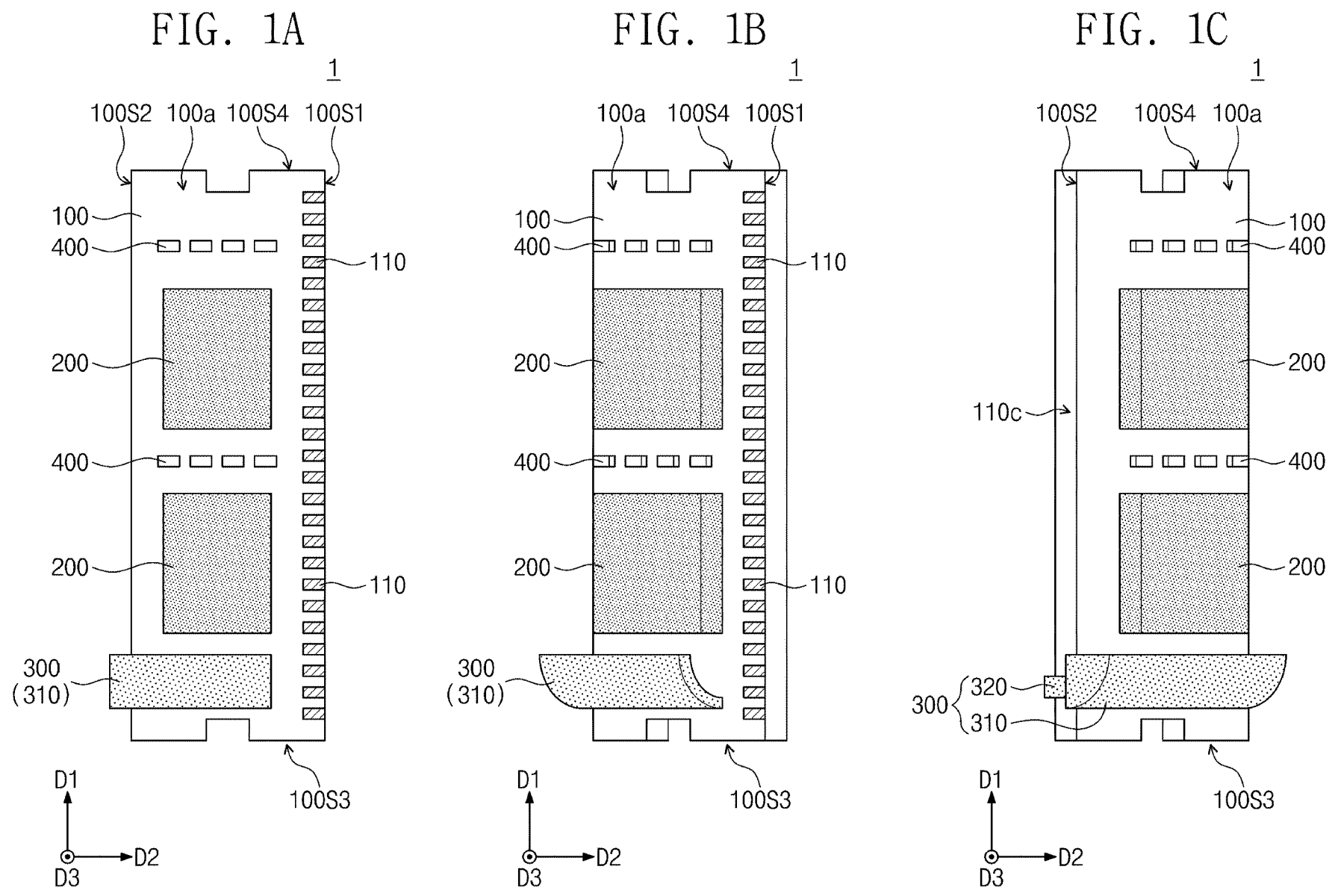
Figure 2:
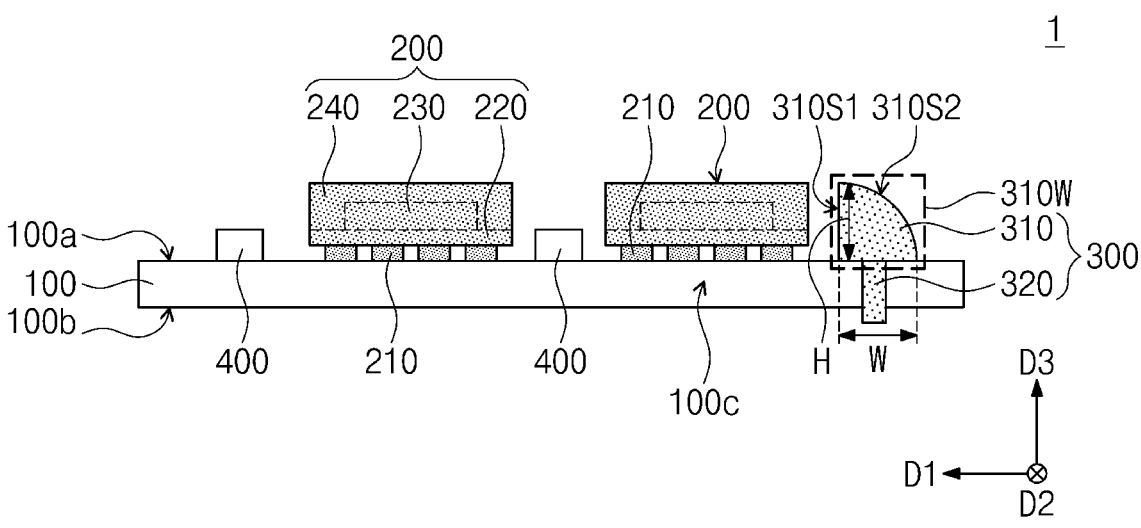
FIG. 2 illustrates a cross-sectional view seen from the second side of the semiconductor module depicted in FIG. 1A.
Figure 3:
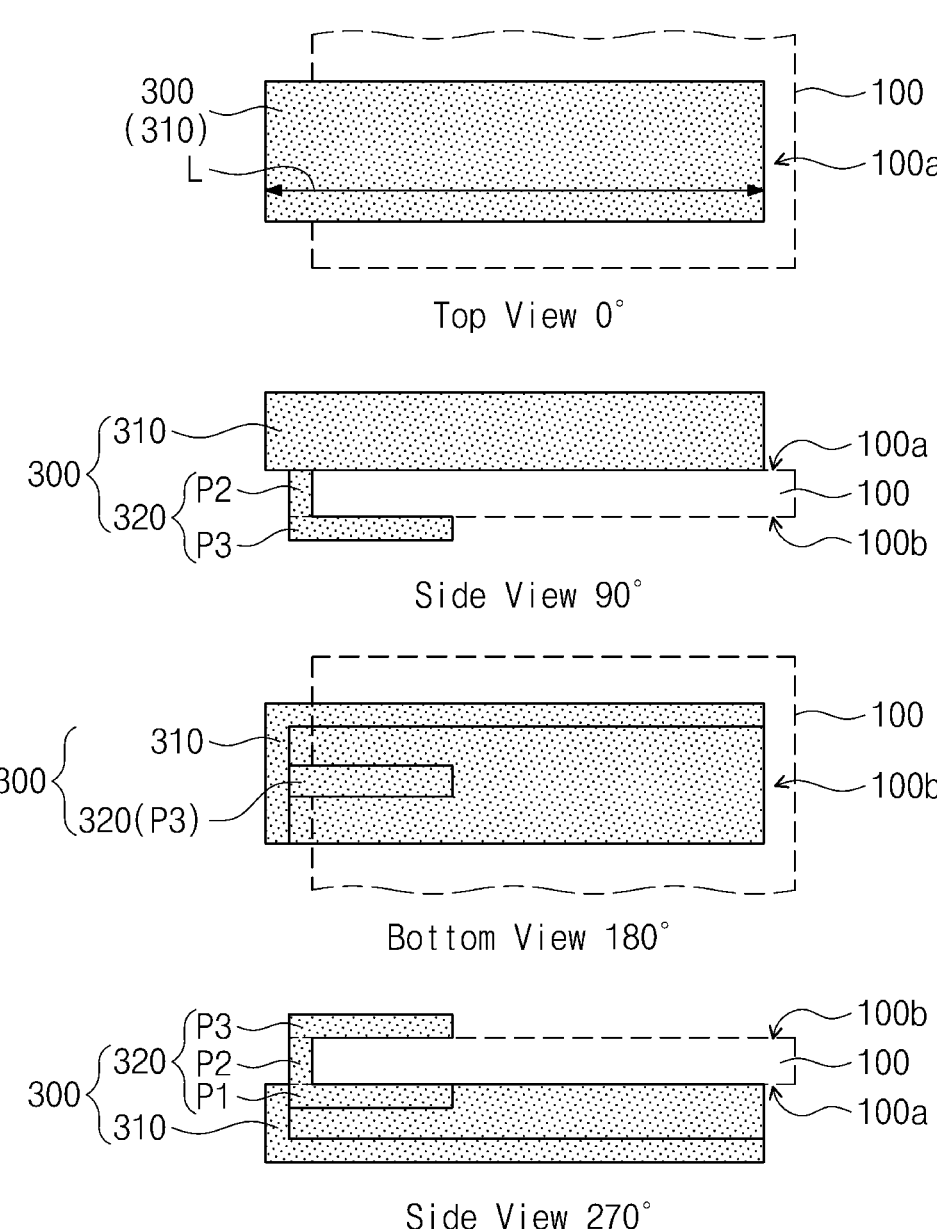
FIG. 3 illustrates diagrams in accordance with a rotation angle of a clip structure depicted in FIG. 1A.

FIG. 1A illustrates a plan view showing a semiconductor module according to some embodiments of the present inventive concepts. FIG. 1B illustrates a perspective view showing a first side of the semiconductor module depicted in FIG. 1A. FIG. 1C illustrates a perspective view showing a second side of the semiconductor module depicted in FIG. 1A. FIG. 2 illustrates a cross-sectional view seen from the second side of the semiconductor module depicted in FIG. 1A. FIG. 3 illustrates diagrams in accordance with a rotation angle of a clip structure depicted in FIG. 1A.

Referring to FIGS. 1A, 1B, 1C, and 2, a semiconductor module 1 may include a module substrate 100, a plurality of tabs 110, a plurality of semiconductor packages 200, a clip structure 300, and a plurality of semiconductor elements 400.

The module substrate 100 may be a printed circuit board (PCB) with a circuit pattern. The module substrate 100 may have a top surface 100a and a bottom surface 100b that are opposite to each other. The module substrate 100 may have a first side 100S1 and a second side S2 that extend in a first direction D1 and face each other, and may also include a third side 100S3 and a fourth side 100S4 that extend in a second direction D2 and face each other. The first direction D1 and the second direction D2 may be parallel to the top surface 100a of the substrate 100 and may be crossed (e.g., orthogonal) to each other.

The plurality of tabs 110 may be disposed on the top surface 100a of the module substrate 100 and adjacent to the first side 100S1. The plurality of tabs 110 may be arranged in the first direction D1 at the first side 100S1 of the module substrate 100. The plurality of tabs 110 may include metal (e.g., copper or aluminum). The plurality of tabs 110 may have their standardized function and arrangement, and for example, may satisfy JEDEC standards. The plurality of tabs 110 may serve either as input/output terminals for data signals or as transfer paths for command/address (C/A) signals.

The plurality of semiconductor packages 200 may be disposed on the top surface 100a of the module substrate 100 and may be arranged in the first direction D1. The plurality of tabs 110 may be spaced apart in the second direction D2 from the plurality of semiconductor packages 200. The plurality of semiconductor packages 200 may be electrically connected to the plurality of tabs 110 through wiring lines in the module substrate 100. Therefore, data signals and command/address signals may be transceived between the plurality of semiconductor packages 200 and the plurality of tabs 110.

Each of the plurality of semiconductor packages 200 may include a package substrate 220, a semiconductor chip 230, and a molding layer 240. The package substrate 220 may be, for example, a printed circuit board (PCB) or a redistribution substrate. The semiconductor chip 230 may be mounted on the package substrate 220, and may be a memory chip, a logic chip, an application processor (AP) chip, or a system-on-chip (SOC). The package substrate 220 may be provided thereon with the molding layer 240 that encapsulates the semiconductor chip 230. The plurality of semiconductor packages 200 may be memory packages, and in this case, the semiconductor chip 230 may be a memory chip. The semiconductor chip 230 may include, for example, dynamic random access memory (DRAM), static random access memory (SRAM), or synchronous dynamic random access memory (SDRAM).

Connection terminals 210 may be interposed between the module substrate 100 and each of the plurality of semiconductor packages 200. Each of the plurality of semiconductor packages 200 may be electrically connected through connection terminals 210 to the module substrate 100 (e.g., to the wiring lines in the module substrate 100). The connection terminals 210 may include at least one selected from pillars, bumps, and solder balls, and may be formed of a conductive material. The semiconductor chip 230 included in each of the plurality of semiconductor packages 200 may be electrically connected through the package substrate 220 and the connection terminals 210 to the module substrate 100 (e.g., to the wiring lines in the module substrate 100).

The plurality of semiconductor elements 400 may be disposed on the top surface 100a of the module substrate 100, and may be horizontally spaced apart from the plurality of semiconductor packages 200. The plurality of semiconductor elements 400 may include an active element or a passive element (e.g., resistor, capacitor, or inductor). The plurality of semiconductor elements 400 may be electrically connected to the plurality of semiconductor packages 200 through the module substrate 100 (e.g., through the wiring lines in the module substrate 100).

Referring to FIGS. 1A, 1B, 1C, 2, and 3, the clip structure 300 may be disposed on the top surface 100a of the module substrate 100, and may be horizontally spaced apart from the plurality of semiconductor packages 200, the plurality of semiconductor elements 400, and the plurality of tabs 110. The plurality of tabs 110 may be spaced apart in the second direction D2 from the clip structure 300. The clip structure 300 may be disposed on the top surface 100a of the module substrate 100. The clip structure 300 may include a body part 310 that is horizontally spaced apart from the plurality of semiconductor packages 200, the plurality of semiconductor elements 400, and the plurality of tabs 110, and may also include a connection part 320 that extends from the body part 310 across a lateral surface 100c of the module substrate 100 onto the bottom surface 100b of the module substrate 100. The connection part 320 of the clip structure 300 may be disposed adjacent to the second side 100S2 of the module substrate 100, and the body part 310 of the clip structure 300 may be spaced apart in the second direction D2 from the plurality of tabs 110.

According to some embodiments, the body part 310 of the clip structure 300 may be placed between an outermost one of the plurality of semiconductor packages 200 and the third side 100S3 of the module substrate 100. Among the plurality of semiconductor packages 200, the outermost semiconductor package 200 may be a semiconductor package that is adjacent to or closest to the third side 100S3 of the module substrate 100. The body part 310 may have a bar shape that extends in the second direction D2 between the outermost semiconductor package 200 and the third side 100S3 of the module substrate 100.

The body part 310 may have a first lateral surface 310S1 that faces the outermost semiconductor package 200 and a second lateral surface 310S2 that stands opposite to the first lateral surface 310S1. According to some embodiments, the second lateral surface 310S2 of the body part 310 may be a curved surface. When viewed from the second side 100S2 of the module substrate 100, as illustrated in FIG. 2, the body part 310 may have a half-streamline shaped sidewall 310W. The body part 310 may have a height H in a third direction D3 perpendicular to the top surface 100a of the module substrate 100, and for example, the height H of the body part 310 may range from about 0.01 mm to about 100 mm. A maximum height H of the body part 310 may be substantially the same as a height of an uppermost surface of each of the plurality of semiconductor packages 200. The body part 310 may have a width W in the first direction D1, and for example, the width W of the body part 310 may range from 0.01 mm to about 200 mm. The body part 310 may have a length L in the second direction D2, and for example, the length L of the body part 310 may range from about 0.01 mm to about 200 mm.

The connection part 320 may include a first portion P1 that extends from the sidewall 310W of the body part 310 onto the top surface 100a of the module substrate 100, a second portion P2 that extends from the first portion P1 onto the lateral surface 100c of the module substrate 100, and a third portion P3 that extends from the second portion P2 onto the bottom surface 100b of the module substrate 100. The module substrate 100 may be inserted into between the first and third portions P1 and P3 of the connection part 320, and accordingly, the clip structure 300 may be physically attached to the module substrate 100.

The clip structure 300 may include a non-conductive material. For example, the clip structure 300 may be formed of one or more of plastics, fiber, rubber, sponge, urethane, carbon materials, and/or porous materials. The clip structure 300 may be electrically separated from or signal isolated from the plurality of semiconductor packages 200, the plurality of tabs 110, and the plurality of semiconductor elements 400.

When two-phase immersion cooling is employed to cool the semiconductor module 1, vapor produced due to a state change of a non-conductive coolant may be trapped between the module substrate 100 and each of the plurality of semiconductor packages 200. In this case, a low thermal conductivity of the vapor may interrupt heat transfer from the plurality of semiconductor packages 200 to the non-conductive coolant, and thus the semiconductor module 1 may decrease in reliability.

According to the present inventive concepts, the clip structure 300 may change a flow of vapor produced in two-phase immersion cooling. For example, the vapor produced in two-phase immersion cooling may ascend along the first direction D1, and the clip structure 300 may change a flow path of the vapor. Accordingly, the vapor may be suppressed from being trapped between the module substrate 100 and each of the plurality of semiconductor packages 200, and the non-conductive coolant with high thermal conductivity may fill or at least partially occupy a space between the module substrate 100 and each of the plurality of semiconductor packages 200. As a result, heat may be easily transferred from the plurality of semiconductor packages 200 to the non-conductive coolant, and therefore the production of semiconductor module 1 may increase in reliability. In addition, as the second lateral surface 310S2 of the body part of the clip structure 300 is shaped like a curved surface, it may be possible to improve fluidity of the non-conductive coolant used in two-phase immersion cooling.

Figure 4C:
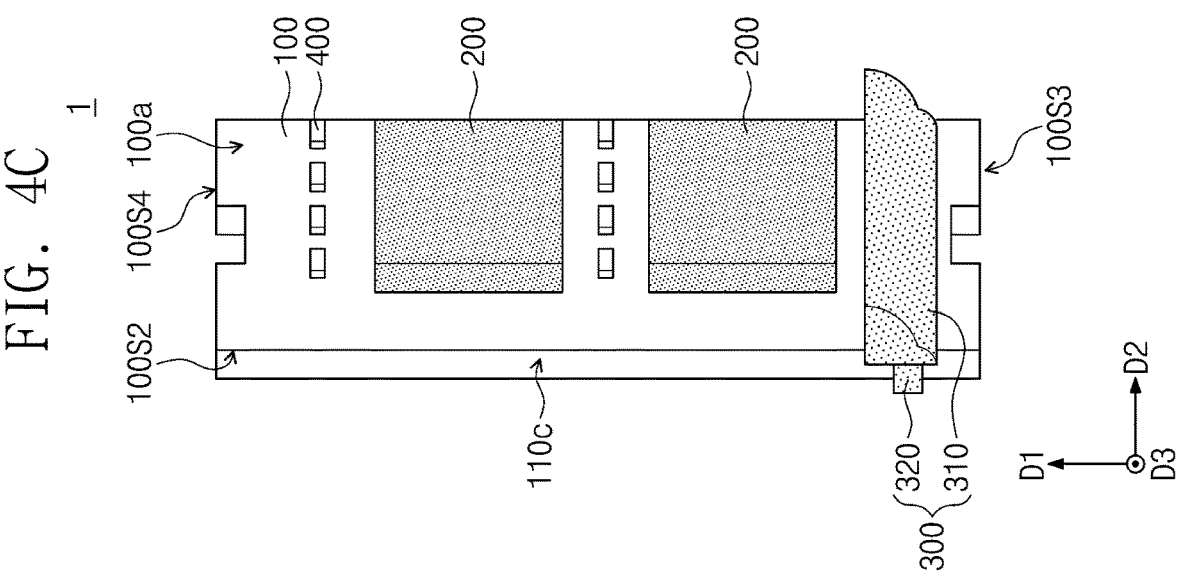
FIG. 4C illustrates a perspective view showing a second side of the semiconductor module depicted in FIG. 4A.
Figure 4B:
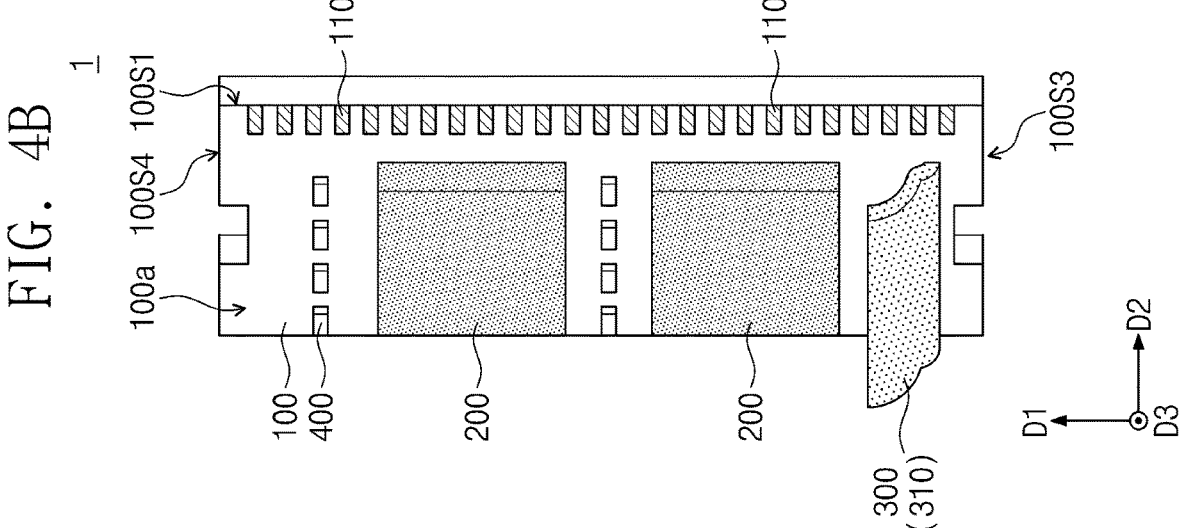
FIG. 4B illustrates a perspective view showing a first side of the semiconductor module depicted in FIG. 4A.
Figure 4A:
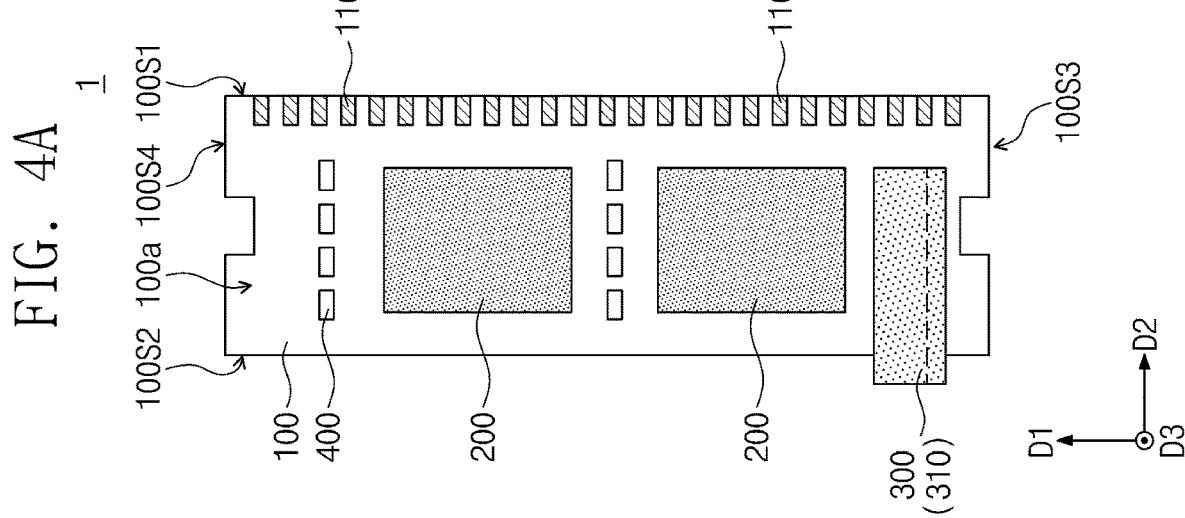
FIG. 4A illustrates a plan view showing a semiconductor module according to some embodiments of the present inventive concepts.
Figure 5:
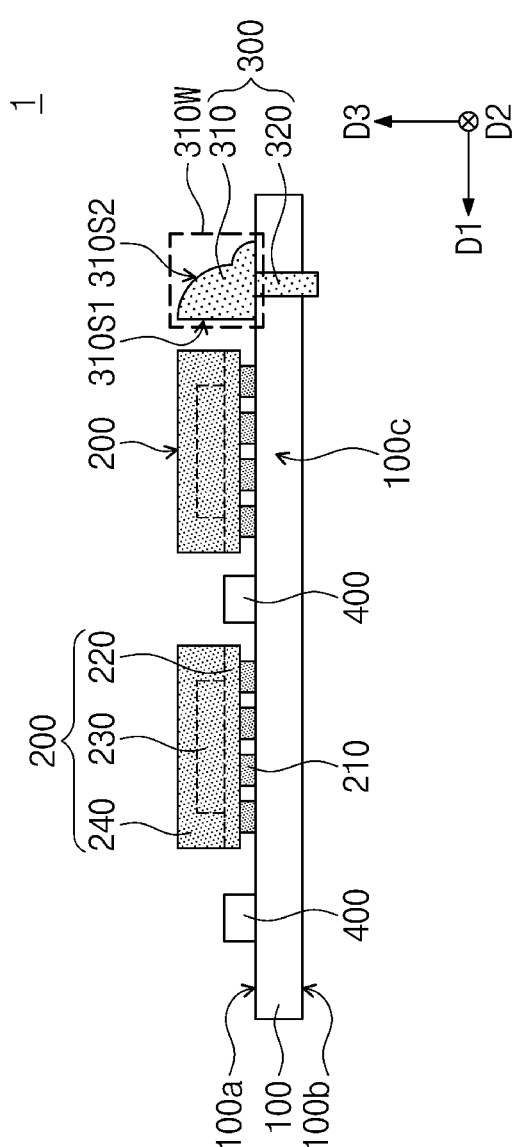
FIG. 5 illustrates a cross-sectional view seen from the second side of the semiconductor module depicted in FIG. 4A.

FIG. 4A illustrates a plan view showing a semiconductor module according to some embodiments of the present inventive concepts. FIG. 4B illustrates a perspective view showing a first side of the semiconductor module depicted in FIG. 4A. FIG. 4C illustrates a perspective view showing a second side of the semiconductor module depicted in FIG. 4A. FIG. 5 illustrates a cross-sectional view seen from the second side of the semiconductor module depicted in FIG. 4A. In the embodiment that follows, differences from the semiconductor module described with reference to FIGS. 1A, 1B, 1C, 2, and 3 will be mainly discussed herein in the interest of brevity.

Referring to FIGS. 4A, 4B, 4C, and 5, the body part 310 of the clip structure 300 may have a first lateral surface 310S1 that faces the outermost semiconductor package 200 and a second lateral surface 310S2 that stands opposite to the first lateral surface 310S1. According to some embodiments, the second lateral surface 301S2 of the body part 310 may be a curved surface, and may have a plurality of curvatures different from each other. For example, the second lateral surface 310S2 of the body part 310 may be a curved surface having two different curvatures. When viewed from the second side 100S2 of the module substrate 100, as illustrated in FIG. 5, the body part 310 may have a half-dolphin shaped sidewall 310W.

According to some embodiments, as the second lateral surface 310S2 of the body part of the clip structure 300 is shaped like a curved surface having a plurality of curvatures different from each other, it may be possible to improve fluidity of the non-conductive coolant used in two-phase immersion cooling.

Figure 6C:
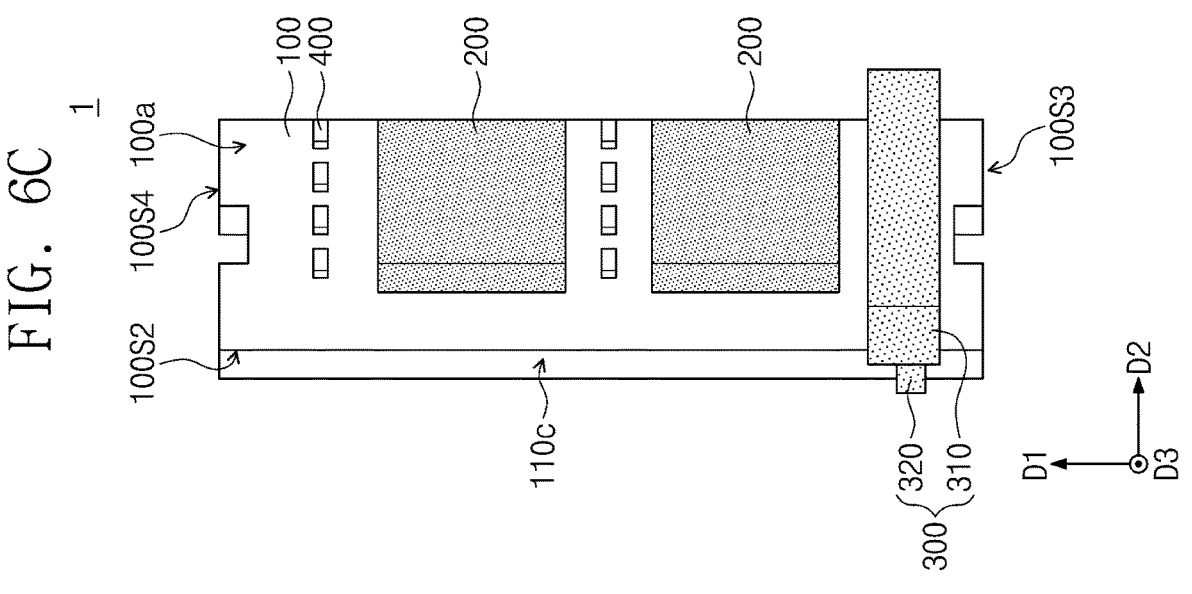
FIG. 6C illustrates a perspective view showing a second side of the semiconductor module depicted in FIG. 6A.
Figure 6B:
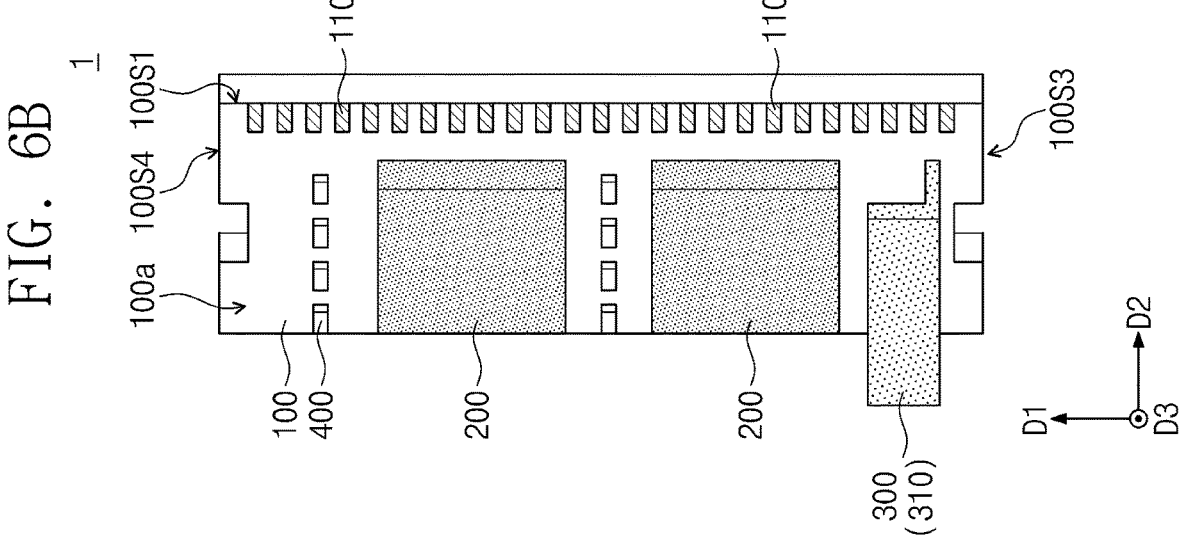
FIG. 6B illustrates a perspective view showing a first side of the semiconductor module depicted in FIG. 6A.
Figure 6A:
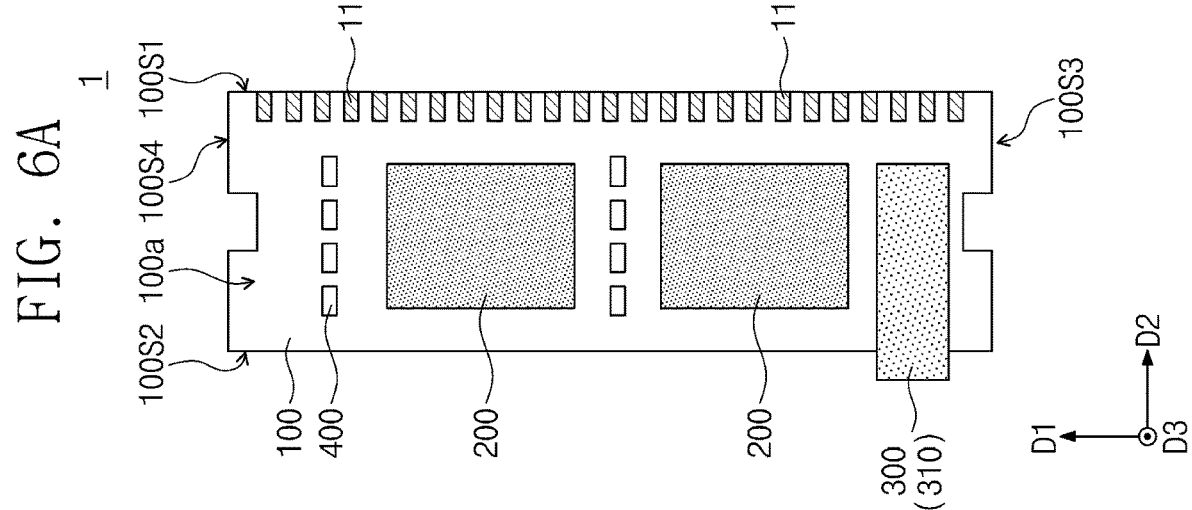
FIG. 6A illustrates a plan view showing a semiconductor module according to some embodiments of the present inventive concepts.
Figure 7:
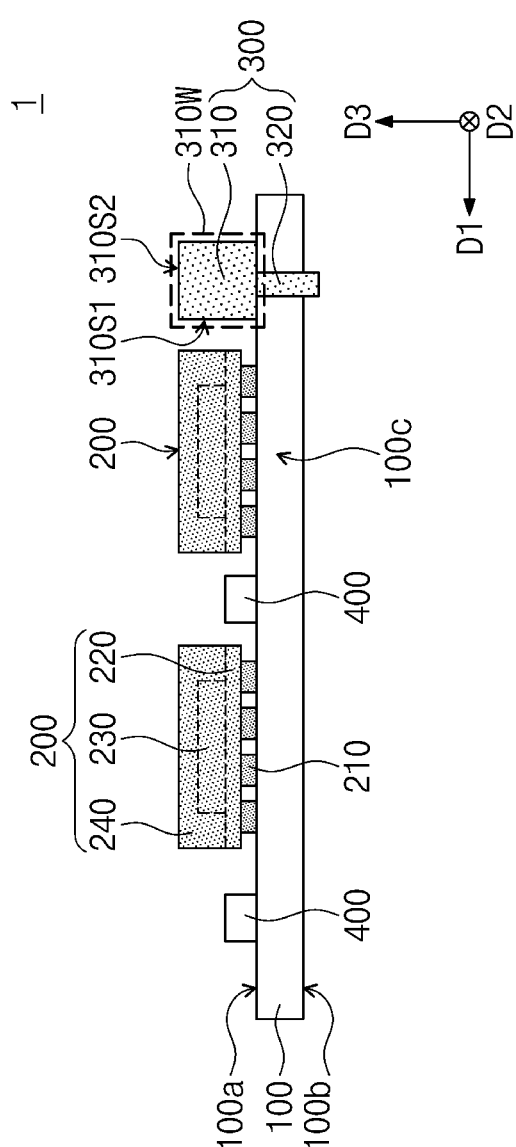
FIG. 7 illustrates a cross-sectional view seen from the second side of the semiconductor module depicted in FIG. 6A.

FIG. 6A illustrates a plan view showing a semiconductor module according to some embodiments of the present inventive concepts. FIG. 6B illustrates a perspective view showing a first side of the semiconductor module depicted in FIG. 6A. FIG. 6C illustrates a perspective view showing a second side of the semiconductor module depicted in FIG. 6A. FIG. 7 illustrates a cross-sectional view seen from the second side of the semiconductor module depicted in FIG. 6A. In the embodiment that follows, differences from the semiconductor module described with reference to FIGS. 1A, 1B, 1C, 2, and 3 will be mainly discussed herein in the interest of brevity.

Referring to FIGS. 6A, 6B, 6C, and 7, the body part 310 of the clip structure 300 may have a first lateral surface 310S1 that faces the outermost semiconductor package 200 and a second lateral surface 310S2 that stands opposite to the first lateral surface 310S1. According to some embodiments, the second lateral surface 310S2 of the body part 310 may be an angled surface. When viewed from the second side 100S2 of the module substrate 100, as illustrated in FIG. 7, the body part 310 may have a rectangular sidewall 310W.

Figure 8C:
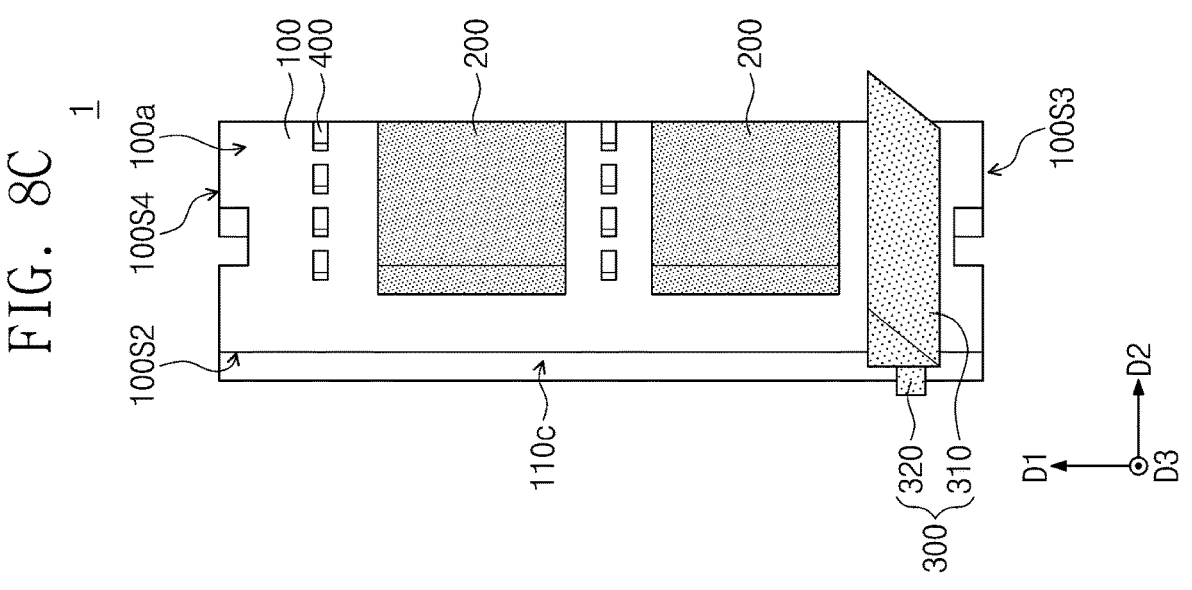
FIG. 8C illustrates a perspective view showing a second side of the semiconductor module depicted in FIG. 8A.
Figure 8B:
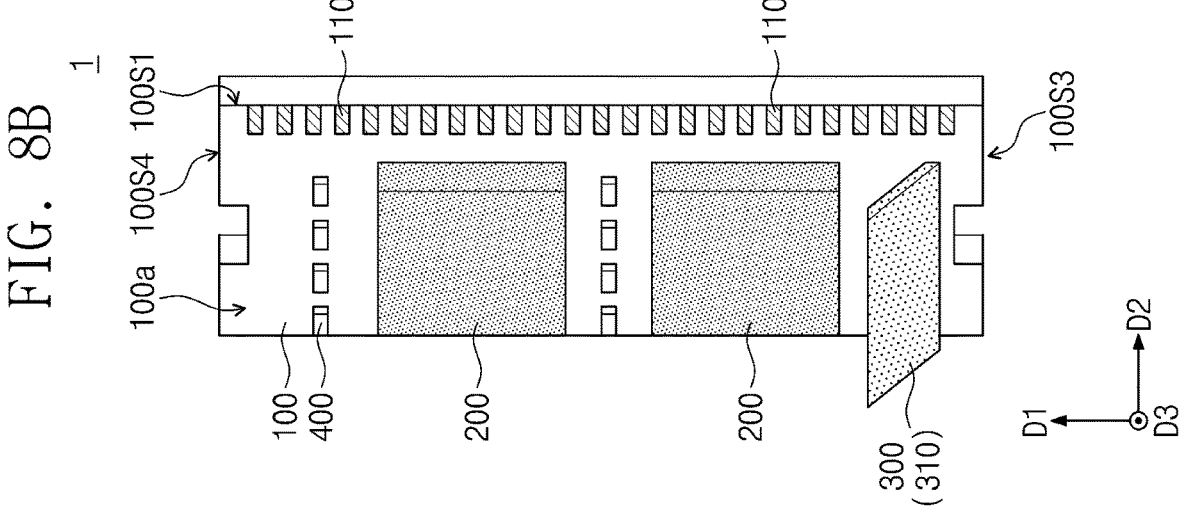
FIG. 8B illustrates a perspective view showing a first side of the semiconductor module depicted in FIG. 8A.
Figure 8A:
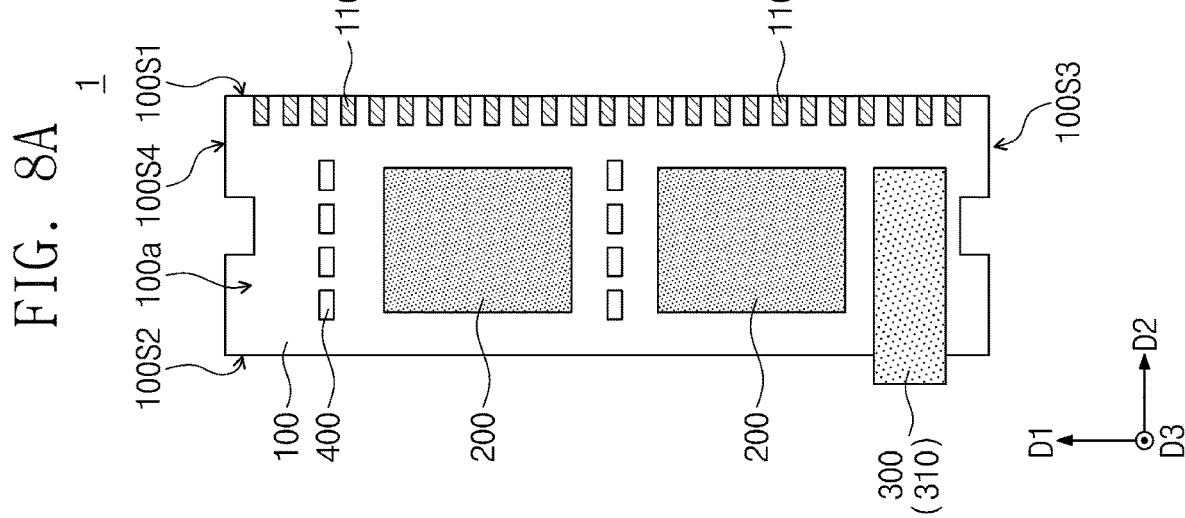
FIG. 8A illustrates a plan view showing a semiconductor module according to some embodiments of the present inventive concepts.
Figure 9:
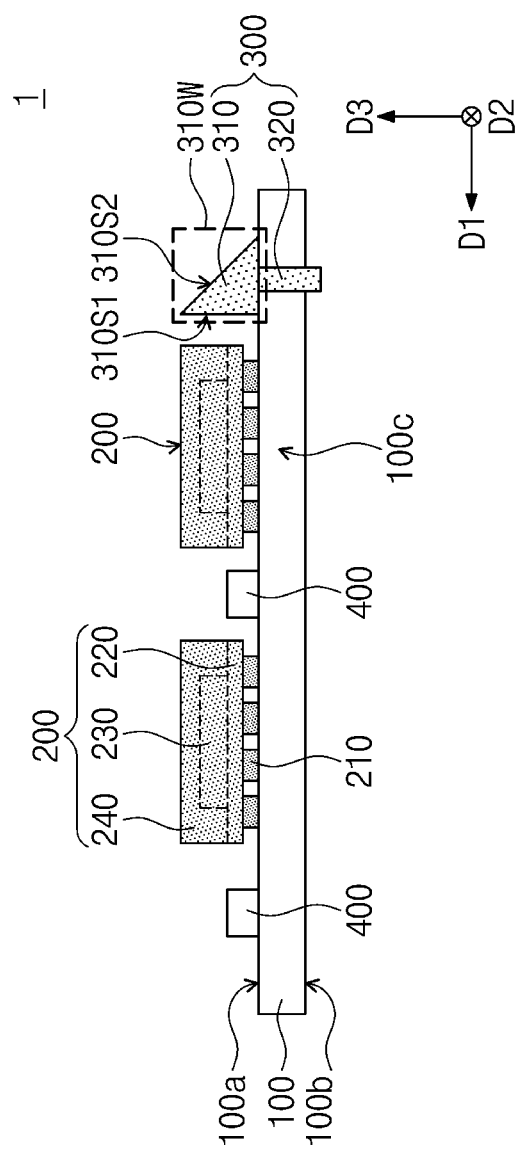
FIG. 9 illustrates a cross-sectional view seen from the second side of the semiconductor module depicted in FIG. 8A.

FIG. 8A illustrates a plan view showing a semiconductor module according to some embodiments of the present inventive concepts. FIG. 8B illustrates a perspective view showing a first side of the semiconductor module depicted in FIG. 8A. FIG. 8C illustrates a perspective view showing a second side of the semiconductor module depicted in FIG. 8A. FIG. 9 illustrates a cross-sectional view seen from the second side of the semiconductor module depicted in FIG. 8A. In the embodiment that follows, differences from the semiconductor module described with reference to FIGS. 1A, 1B, 1C, 2, and 3 will be mainly discussed herein in the interest of brevity.

Referring to FIGS. 8A, 8B, 8C, and 9, the body part 310 of the clip structure 300 may have a first lateral surface 310S1 that faces the outermost semiconductor package 200 and a second lateral surface 310S2 that stands opposite to the first lateral surface 310S1. According to some embodiments, the second lateral surface 310S2 of the body part 310 may have a plane shape that is inclined to the top surface 100a of the module substrate 100. When viewed from the second side 100S2 of the module substrate 100, as illustrated in FIG. 9, the body part 310 may have a triangular (e.g., right-angled triangular) sidewall 310W.

Figure 10C:
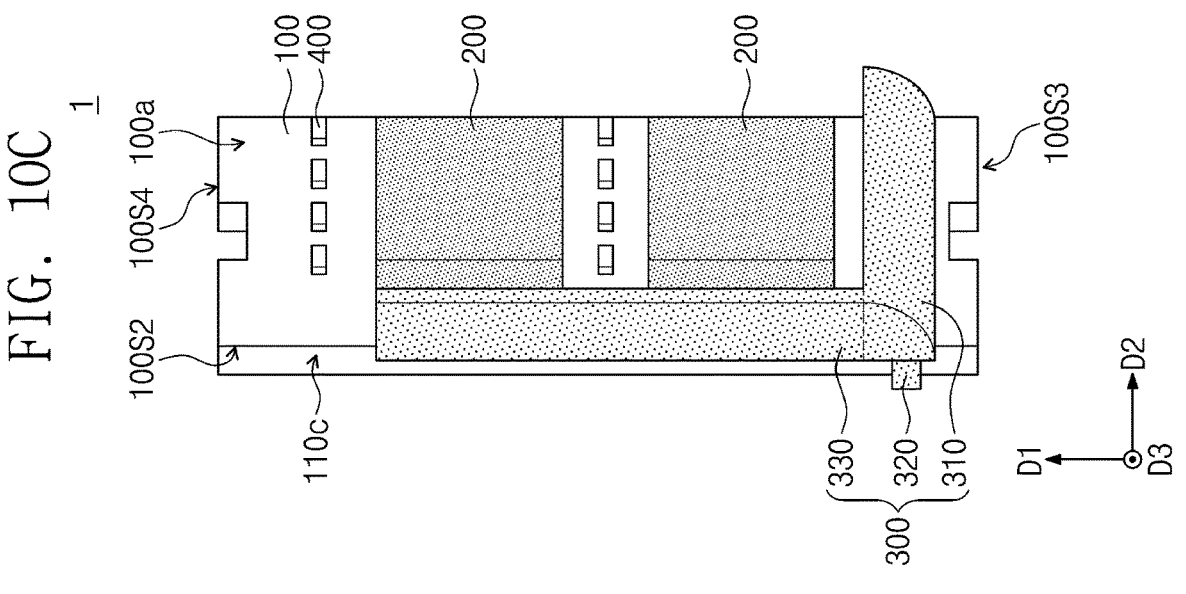
FIG. 10C illustrates a perspective view showing a second side of the semiconductor module depicted in FIG. 10A.
Figure 10B:
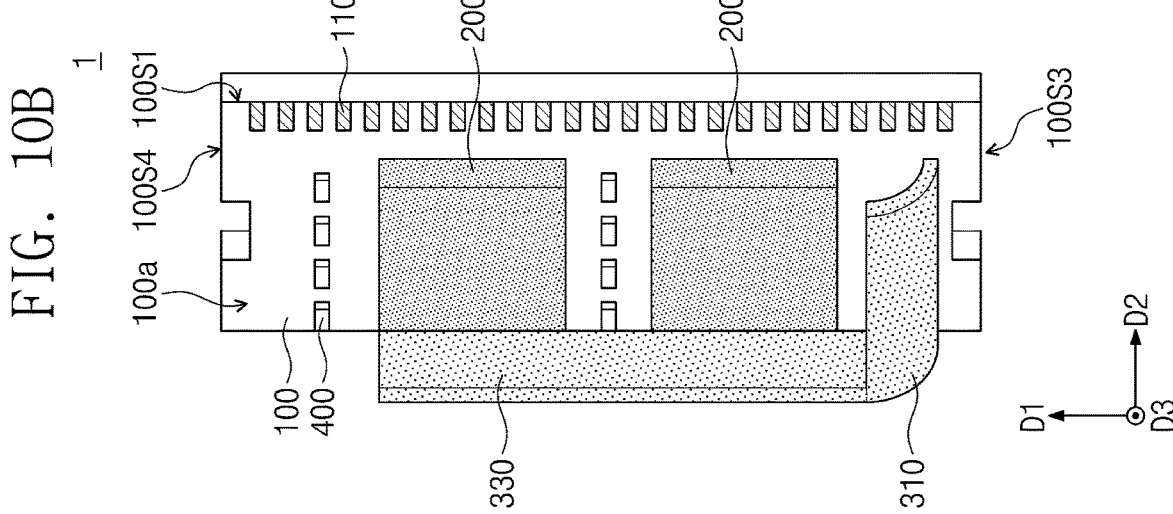
FIG. 10B illustrates a perspective view showing a first side of the semiconductor module depicted in FIG. 10A.
Figure 10A:
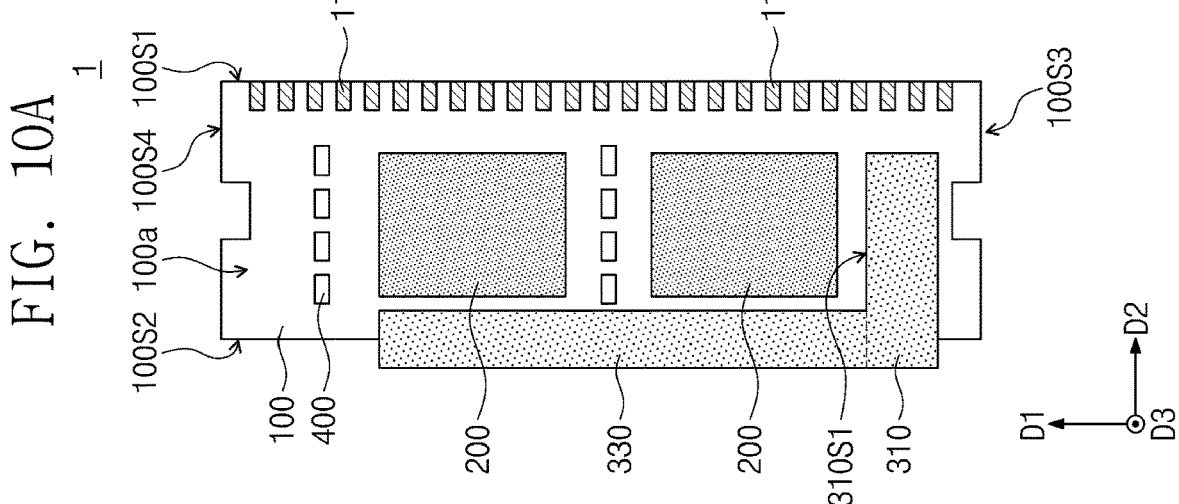
FIG. 10A illustrates a plan view showing a semiconductor module according to some embodiments of the present inventive concepts.
Figure 11:
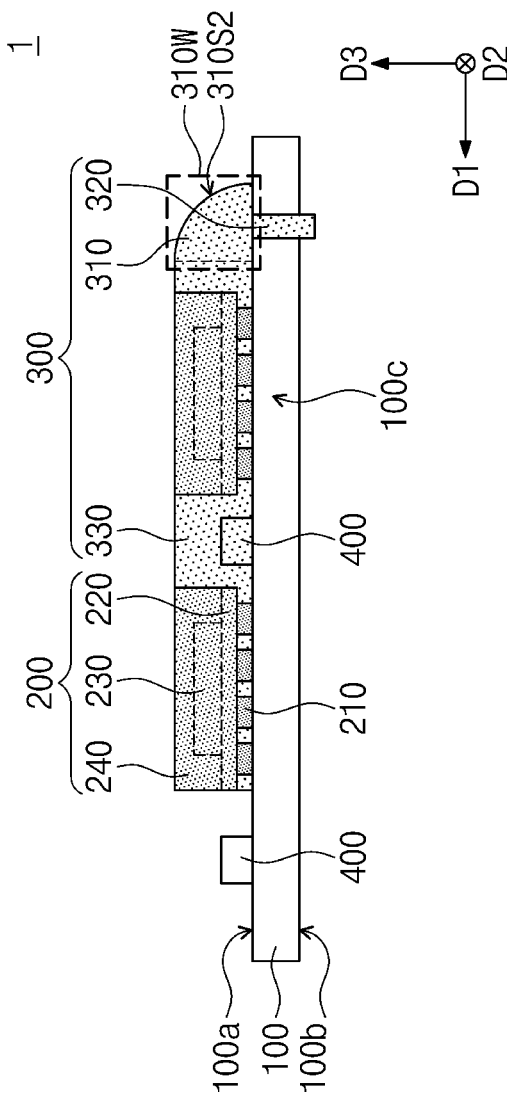
FIG. 11 illustrates a cross-sectional view seen from the second side of the semiconductor module depicted in FIG. 10A.

FIG. 10A illustrates a plan view showing a semiconductor module according to some embodiments of the present inventive concepts. FIG. 10B illustrates a perspective view showing a first side of the semiconductor module depicted in FIG. 10A. FIG. 10C illustrates a perspective view showing a second side of the semiconductor module depicted in FIG. 10A. FIG. 11 illustrates a cross-sectional view seen from the second side of the semiconductor module depicted in FIG. 10A. In the embodiment that follows, differences from the semiconductor module described with reference to FIGS. 1A, 1B, 1C, 2, and 3 will be mainly discussed herein in the interest of brevity.

Referring to FIGS. 10A, 10B, 10C, and 11, the clip structure 300 may be disposed on the top surface 100a of the module substrate 100, and may be horizontally spaced apart from the plurality of semiconductor packages 200, the plurality of semiconductor elements 400, and the plurality of tabs 110. The plurality of tabs 110 may be spaced apart in the second direction D2 from the clip structure 300. The clip structure 300 may include a body part 310 and 330 on the top surface 100a of the module substrate 100 and horizontally spaced apart from the plurality of semiconductor packages 200, the plurality of semiconductor elements 400, and the plurality of tabs 110, and may also include a connection part 320 that extends from the body part 310 and 330 across the lateral surface 100c of the module substrate 100 onto the bottom surface 100b of the module substrate 100. The connection part 320 of the clip structure 300 may be disposed adjacent to the second side 100S2 of the module substrate 100, and the body part 310 and 330 of the clip structure 300 may be spaced apart in the second direction D2 from the plurality of tabs 110.

According to some embodiments, the body part 310 and 330 of the clip structure 300 may include a first body part 310 disposed between an outermost one of the plurality of semiconductor packages 200 and the third side 100S3 of the module substrate 100, and may also include a second body part 330 that is disposed adjacent to the second side 100S2 of the module substrate 100 and extends in the first direction D1 at one side of the plurality of semiconductor packages 200. Among the plurality of semiconductor packages 200, the outermost semiconductor package 200 may be a semiconductor package that is most adjacent to the third side 100S3 of the module substrate 100. The first body part 310 may have a bar shape that extends in the second direction D2 between the outermost semiconductor package 200 and the third side 100S3 of the module substrate 100. The second body part 330 may have a bar shape that extends in the first direction D1 at one side of the plurality of semiconductor packages 200. The first body part 310 and the second body part 330 may be connected to each other on the top surface 100a of the module substrate 100, and may constitute an L shape when viewed in a plan.

The first body part 310 may have a first lateral surface 310S1 that faces the outermost semiconductor package 200 and a second lateral surface 310S2 that stands opposite to the first lateral surface 310S1. According to some embodiments, the second lateral surface 310S2 of the first body part 310 may be a curved surface. When viewed from the second side 100S2 of the module substrate 100, as illustrated in FIG. 11, the first body part 310 may have a half-streamline shaped sidewall 310W. According to some embodiments, as illustrated in FIG. 5, the second lateral surface 310S2 of the first body part 310 may be a curved surface having two different curvatures. In this case, when viewed from the second side 100S2 of the module substrate 100, as illustrated in FIG. 5, the first body part 310 may have a half-dolphin shaped sidewall 310W. According to some embodiments, as illustrated in FIG. 7, the second lateral surface 310S2 of the first body part 310 may be an angled surface. In this case, when viewed from the second side 100S2 of the module substrate 100, as illustrated in FIG. 7, the first body part 310 may have a rectangular sidewall 310W. According to some embodiments, as illustrated in FIG. 9, the second lateral surface 310S2 of the first body part 310 may have a plane shape that is inclined to the top surface 100a of the module substrate

100. In this case, when viewed from the second side 100S2 of the module substrate 100, as illustrated in FIG. 9, the first body part 310 may have a rectangular (e.g., right-angled rectangular) sidewall 310W. The second body part 330 may have a plane shape that extends in the first direction D1.

As discussed with reference to FIG. 3, the connection part 320 may include a first portion P1 that extends from the sidewall 310W of the first body part 310 onto the top surface 100a of the module substrate 100, a second portion P2 that extends from the first portion P1 onto the lateral surface 100c of the module substrate 100, and a third portion P3 that extends from the second portion P2 onto the bottom surface 100b of the module substrate 100. The module substrate 100 may be inserted into between the first and third portions P1 and P3 of the connection part 320, and accordingly, the clip structure 300 may be physically attached to the module substrate 100.

Figures 12A, 12B, 12C:
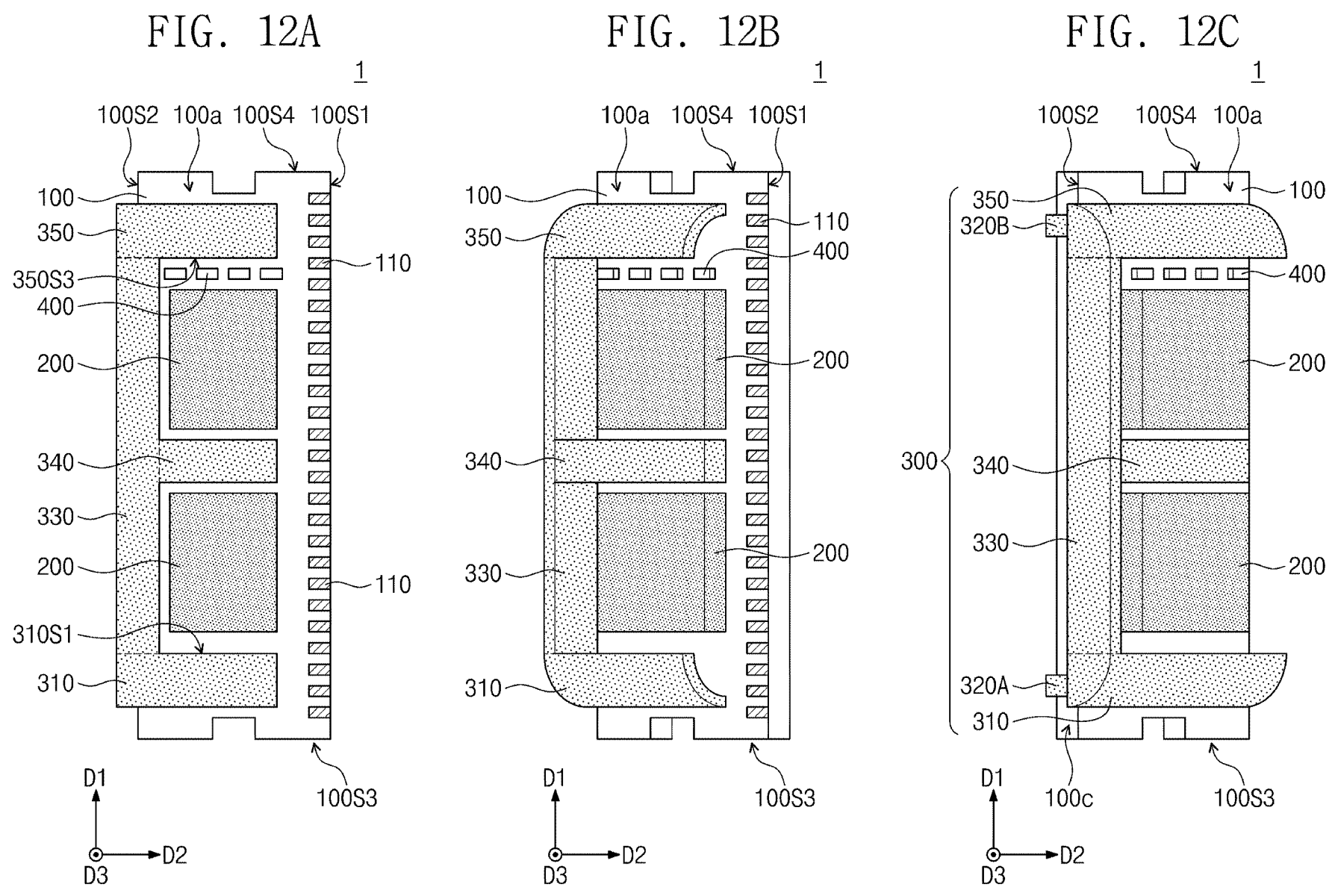
Figure 13:
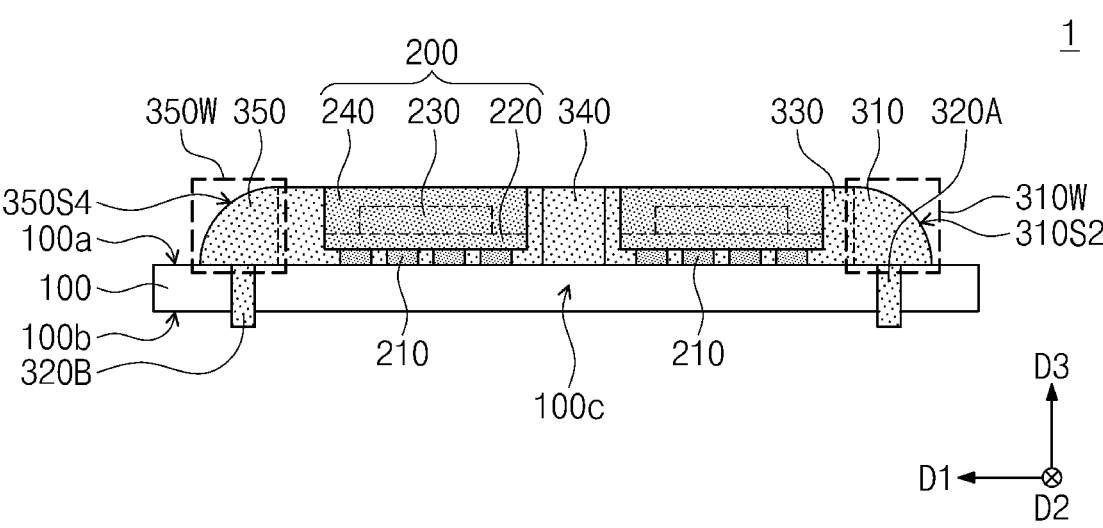
FIG. 13 illustrates a cross-sectional view seen from the second side of the semiconductor module depicted in FIG. 12A.

FIG. 12A illustrates a plan view showing a semiconductor module according to some embodiments of the present inventive concepts. FIG. 12B illustrates a perspective view showing a first side of the semiconductor module depicted in FIG. 12A. FIG. 12C illustrates a perspective view showing a second side of the semiconductor module depicted in FIG. 12A. FIG. 13 illustrates a cross-sectional view seen from the second side of the semiconductor module depicted in FIG. 12A. In the embodiment that follows, differences from the semiconductor module described with reference to FIGS. 1A, 1B, 1C, 2, and 3 will be mainly discussed herein in the interest of brevity.

Referring to FIGS. 12A, 12B, 12C, and 13, the clip structure 300 may be disposed on the top surface 100a of the module substrate 100, and may be horizontally spaced apart from the plurality of semiconductor packages 200, the plurality of semiconductor elements 400, and the plurality of tabs 110. The plurality of tabs 110 may be spaced apart in the second direction D2 from the clip structure 300. The clip structure 300 may include a body part 310, 330, 340, and 350 on the top surface 100a of the module substrate 100 and horizontally spaced apart from the plurality of semiconductor packages 200, the plurality of semiconductor elements 400, and the plurality of tabs 110, and may also include a connection part 320A and 320B that extend from the body part 310, 330, 340, and 350 across the lateral surface 100c of the module substrate 100 onto the bottom surface 100b of the module substrate 100. The connection part 320A and 320B of the clip structure 300 may be disposed adjacent to the second side 100S2 of the module substrate 100, and the body part 310, 330, 340, and 350 of the clip structure 300 may be spaced apart in the second direction D2 from the plurality of tabs 110.

According to some embodiments, the body part 310, 330, 340, and 350 of the clip structure 300 may include a first body part 310 disposed between a first outermost one of the plurality of semiconductor packages 200 and the third side 100S3 of the module substrate 100, a second body part 330 that is disposed adjacent to the second side 100S2 of the module substrate 100 and extends in the first direction D1 at one side of the plurality of semiconductor packages 200, a third body part 350 disposed between a second outermost one of the plurality of semiconductor packages 200 and the fourth side 100S4 of the module substrate 100, and a fourth body part 340 disposed between the plurality of semiconductor packages 200. Among the plurality of semiconductor packages 200, the first outermost semiconductor package 200 may be a semiconductor package that is most adjacent to the third side 100S3 of the module substrate 100, and the second outermost semiconductor package 200 may be a semiconductor package that is most adjacent to the fourth side 100S4 of the module substrate 100. The first body part 310 may have a bar shape that extends in the second direction D2 between the first outermost semiconductor package 200 and the third side 100S3 of the module substrate 100. The second body part 330 may have a bar shape that extends in the first direction D1 at one side of the plurality of semiconductor packages 200. The third body part 350 may have a bar shape that extends in the second direction D2 between the second outermost semiconductor package 200 and the fourth side 100S4 of the module substrate 100. The fourth body part 340 may have a bar shape that extends in the second direction D2 between the plurality of semiconductor packages 200. The first, second, third, and fourth body parts 310, 330, 350, and 340 may be connected to each other on the top surface 100a of the module substrate 100, and may constitute an E shape when viewed in plan.

The first body part 310 may have a first lateral surface 310S1 that faces the first outermost semiconductor package 200 and a second lateral surface 310S2 that stands opposite to the first lateral surface 310S1. According to some embodiments, the second lateral surface 310S2 of the first body part 310 may be a curved surface. When viewed from the second side 100S2 of the module substrate 100, as illustrated in FIG. 13, the first body part 310 may have a half-streamline shaped sidewall 310W. According to some embodiments, as illustrated in FIG. 5, the second lateral surface 310S2 of the first body part 310 may be a curved surface having two different curvatures. In this case, when viewed from the second side 100S2 of the module substrate 100, as illustrated in FIG. 5, the first body part 310 may have a half-dolphin shaped sidewall 310W. According to some embodiments, as illustrated in FIG. 7, the second lateral surface 310S2 of the first body part 310 may be an angled surface. In this case, when viewed from the second side 100S2 of the module substrate 100, as illustrated in FIG. 7, the first body part 310 may have a rectangular sidewall 310W. According to some embodiments, as illustrated in FIG. 9, the second lateral surface 310S2 of the first body part 310 may have a plane shape that is inclined to the top surface 100a of the module substrate 100. In this case, when viewed from the second side 100S2 of the module substrate 100, as illustrated in FIG. 9, the first body part 310 may have a rectangular (e.g., right-angled rectangular) sidewall 310W.

The third body part 350 may have a shape symmetrical to that of the first body 310. For example, the third body part 350 may have a third lateral surface 350S3 that faces the second outermost semiconductor package 200 and a fourth lateral surface 350S4 that stands opposite to the third lateral surface 350S3. According to some embodiments, the fourth lateral surface 350S4 of the third body part 350 may be a curved surface. When viewed from the second side 100S2 of the module substrate 100, as illustrated in FIG. 13, the third body part 350 may have a half-streamline shaped sidewall 350W. According to some embodiments, as illustrated in FIG. 5, the fourth lateral surface 350S4 of the third body part 350 may be a curved shape having two different curvatures. In this case, when viewed from the second side 100S2 of the module substrate 100, as illustrated in FIG. 5, the third body part 350 may have a half-dolphin shaped sidewall 350W. According to some embodiments, as illustrated in FIG. 7, the fourth lateral surface 350S4 of the third body part 350 may be an angled surface. In this case, when viewed from the second side 100S2 of the module substrate 100, as illustrated in FIG. 7, the third body part 350 may have a rectangular sidewall 350W. According to some embodiments, as illustrated in FIG. 9, the fourth lateral surface 350S4 of the third body part 350 may have a plane shape that is inclined to the top surface 100a of the module substrate 100. In this case, when viewed from the second side 100S2 of the module substrate 100, as illustrated in FIG. 9, the third body part 350 may have a rectangular (e.g., right-angled rectangular) sidewall 350W.

The second body part 330 may have a plane shape that extends in the first direction D1, and the fourth body part 340 may have a plane shape that extends in the second direction D2.

The connection part 320A and 320B may include a first connection part 320A that extends from the sidewall 310W of the first body part 310 across the lateral surface 100c of the module substrate 100 onto the bottom surface 100b of the module substrate 100, and may also include a second connection part 320B that extends from the sidewall 350W of the third body part 350 across the lateral surface 100c of the module substrate 100 onto the bottom surface 100b of the module substrate 100. Each of the first and second connection parts 320A and 320b may have a shape and function that are substantially the same as those of the connection part 320 discussed with reference to FIG. 3.

Figure 14:
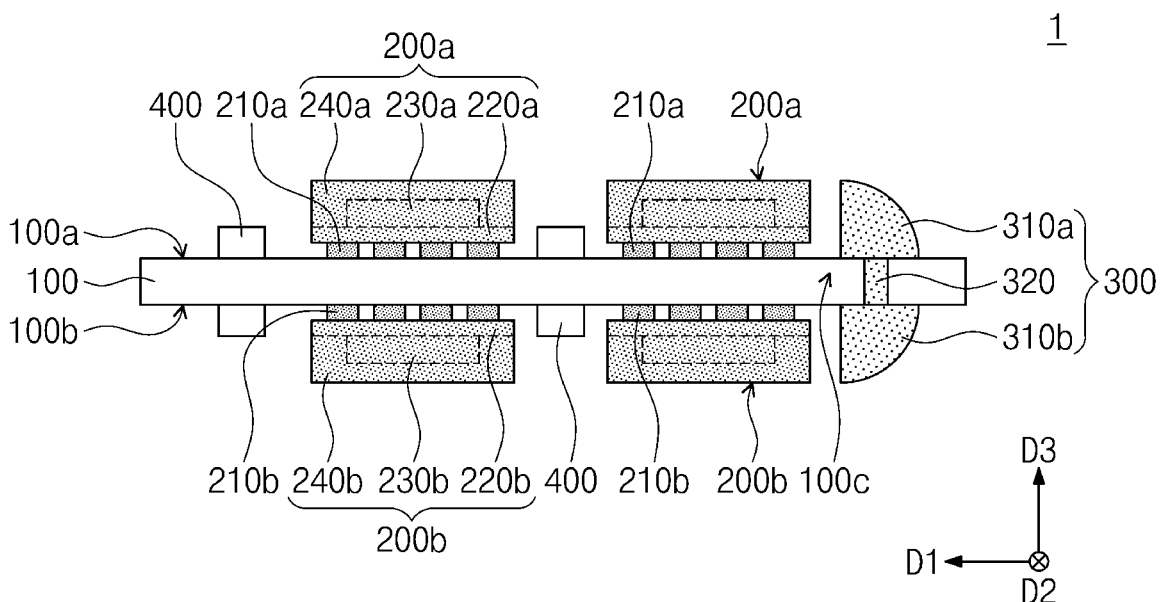
FIG. 14 illustrates a cross-sectional view seen from the second side of the semiconductor module depicted in FIG. 1A according to some embodiments of the present inventive concepts.
Figure 15:
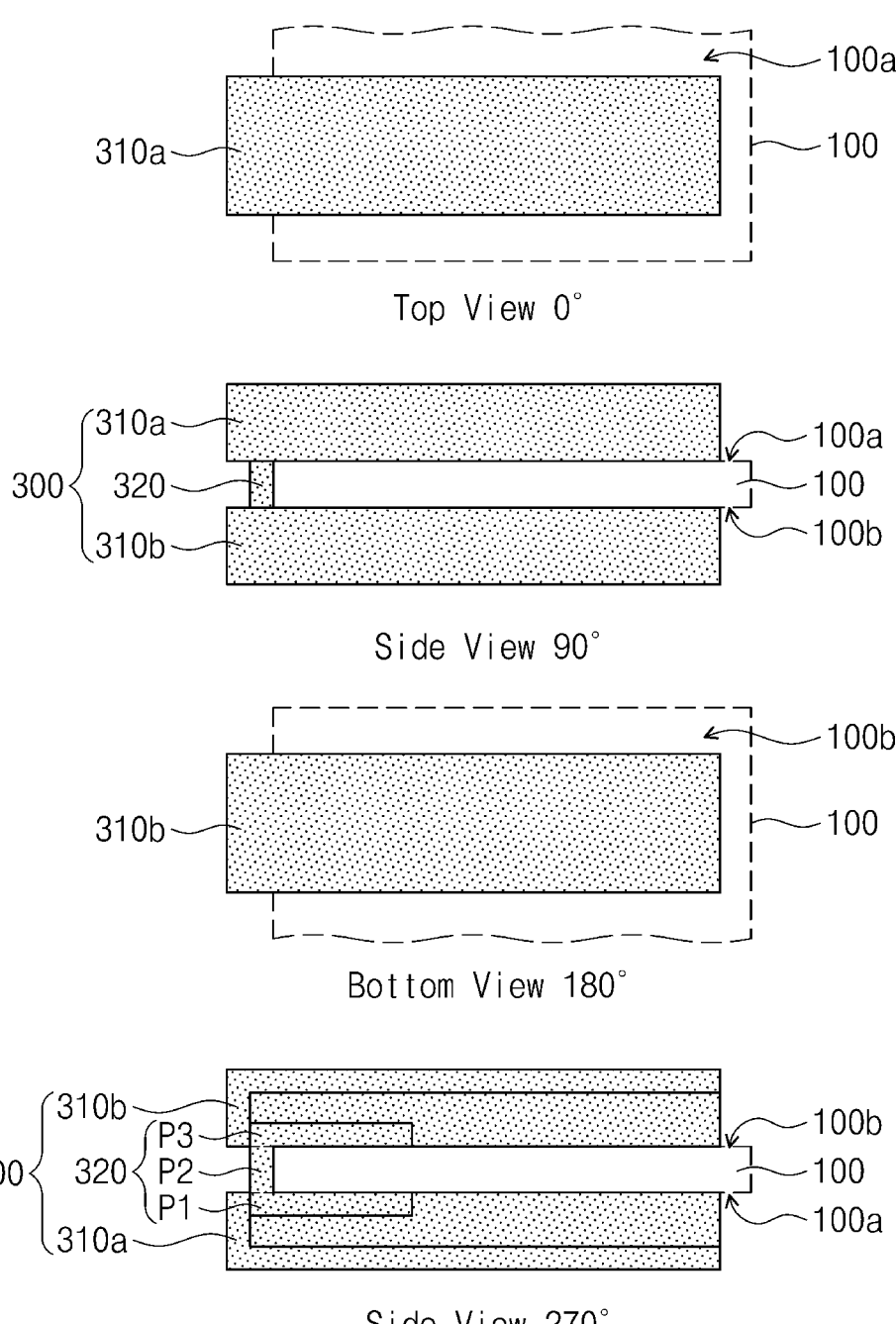
FIG. 15 illustrates diagrams in accordance with a rotation angle of a clip structure depicted in FIG. 14.

FIG. 14 illustrates a cross-sectional view seen from the second side of the semiconductor module depicted in FIG. 1A according to some embodiments of the present inventive concepts. FIG. 15 illustrates diagrams in accordance with a rotation angle of a clip structure depicted in FIG. 14. In the embodiment that follows, differences from the semiconductor module described with reference to FIGS. 1A, 1B, 1C, 2, and 3 will be mainly discussed herein in the interest of brevity.

Referring to FIGS. 1A, 14, and 15, the semiconductor module 1 may include upper semiconductor packages 200a disposed on the top surface 100a of the module substrate 100 and lower semiconductor packages 200b disposed on the bottom surface 100b of the module substrate 100. The plurality of semiconductor packages 200 depicted in FIG. 1A may correspond to the upper semiconductor packages 200a, and the plurality of tabs 110 may be called upper tabs.

The upper semiconductor packages 200a may be arranged in the first direction D1 on the top surface 100a of the module substrate 100. The upper tabs 110 may be spaced apart in the second direction D2 from the upper semiconductor packages 200a. The upper semiconductor packages 200a may be electrically connected to the upper tabs 110 through wiring lines in the module substrate 100. Therefore, data signals and command/address signals may be transceived between the upper semiconductor packages 200a and the upper tabs 110.

Each of the upper semiconductor packages 200a may include an upper package substrate 220a, an upper semiconductor chip 230a, and an upper molding layer 240a. The upper package substrate 220a may be, for example, a printed circuit board (PCB) or a redistribution substrate. The upper semiconductor chip 230a may be mounted on the upper package substrate 220a, and may be a memory chip, a logic chip, an application processor (AP) chip, or a system-on-chip (SOC). The upper molding layer 240a may be disposed on the upper package substrate 220a to encapsulate the upper semiconductor chip 230a. The upper semiconductor packages 220a may be memory packages, and in this case, the upper semiconductor chip 230a may be a memory chip. The upper semiconductor chip 230a may include, for example, dynamic random access memory (DRAM), static random access memory (SRAM), or synchronous dynamic random access memory (SDRAM).

Upper connection terminals 210a may be interposed between the module substrate 100 and the upper package substrate 220a of each of the plurality of upper semiconductor packages 200a. Each of the plurality of upper semiconductor packages 200a may be electrically connected through the upper connection terminals 210a to the module substrate 100 (e.g., to the wiring lines in the module substrate 100). The upper connection terminals 210a may include at least one selected from pillars, bumps, and solder balls, and may be formed of a conductive material. The upper semiconductor chip 230a of each of the plurality of upper semiconductor packages 200a may be electrically connected through the upper package substrate 220a and the upper connection terminals 210a to the module substrate 100 (e.g., to the wiring lines in the module substrate 100).

The lower semiconductor packages 200b may be arranged in the first direction D1 on the bottom surface 100b of the module substrate 100. Although not shown, lower tabs may be disposed on the bottom surface 100b of the module substrate 100. The lower tabs may be configured substantially identical to the upper tabs 110, and may be spaced apart from the lower semiconductor packages 200b. The lower semiconductor packages 200b may be electrically connected to the lower tabs through wiring lines in the module substrate 100. Therefore, data signals and command/address signals may be transceived between the lower tabs and the lower semiconductor packages 200b.

Each of the plurality of lower semiconductor packages 200b may include a lower package substrate 220b, a lower semiconductor chip 230b, and a lower molding layer 240b. The lower package substrate 220b may be, for example, a printed circuit board (PCB) or a redistribution substrate. The lower semiconductor chip 230b may be mounted on the lower package substrate 220b, and may be a memory chip, a logic chip, an application processor (AP) chip, or a system-on-chip (SOC). The lower molding layer 240b may be disposed on the lower package substrate 220b to encapsulate the lower semiconductor chip 230b. The lower semiconductor packages 200b may be memory packages, and in this case, the lower semiconductor chip 230b may be a memory chip. The lower semiconductor chip 230b may include, for example, dynamic random access memory (DRAM), static random access memory (SRAM), or synchronous dynamic random access memory (SDRAM).

Lower connection terminals 210b may be interposed between the module substrate 100 and the lower package substrate 220b of each of the lower semiconductor packages 200b. Each of the lower semiconductor packages 200b may be electrically connected through the lower connection terminals 210b to the module substrate 100 (e.g., to the wiring lines in the module substrate 100). The lower connection terminals 210b may include at least one selected from pillars, bumps, and solder balls, and may be formed of a conductive material. The lower semiconductor chip 230b of each of the plurality of lower semiconductor packages 200b may be electrically connected through the lower package substrate 220b and the lower connection terminals 210b to the module substrate 100 (e.g., to the wiring lines in the module substrate 100).

The plurality of semiconductor elements 400 may be disposed on the top surface 100a of the module substrate 100, and may be horizontally spaced apart from the upper semiconductor packages 200a. In addition, the plurality of semiconductor elements 400 may be disposed on the bottom surface 100b of the module substrate 100, and may be horizontally spaced apart from the lower semiconductor packages 200b.

The clip structure 300 may include an upper body part 300*a* disposed on the top surface 100*a* of the module substrate 100, a lower body part 300*b* disposed on the bottom surface 100*b* of the module substrate 100, and a connection part 320 that extends from the upper body part 300*a* across the lateral surface 100*c* of the module substrate 100 to the lower body part 300*b*. According to some embodiments, the upper body part 300*a* may be configured substantially identical to the body part 310 discussed with reference to FIGS. 1A, 1B, 1C, and 2. According to some embodiments, the upper body part 300*a* may be configured substantially identical to the body part 310 discussed with reference to FIGS. 4A, 4B, 4C, and 5, the body part 310 discussed with reference to FIGS. 6A, 6B, 6C, and 7, or the body part 310 discussed with reference to FIGS. 8A, 8B, 8C, and 9. The lower body part 300*b* may be configured substantially identical to the upper body part 300*a*. The upper body part 300*a* and the lower body part 300*b* may have their shapes that are symmetrical to each other.

The connection part 320 may include a first portion P1 that extends from a sidewall of the first body part 300*a* onto the top surface 100*a* of the module substrate 100, a second portion P2 that extends from the first portion P1 onto the lateral surface 100*c* of the module substrate 100, and a third portion P3 that extends from the second portion P2 onto the bottom surface 100*b* of the module substrate 100. The first, second, and third portions P1, P2, and P3 may be connected to each other and may constitute the connection part 320. The module substrate 100 may be inserted into between the first and third portions P1 and P3 of the connection part 320, and accordingly, the clip structure 300 may be physically attached to the module substrate 100.

Figure 16:
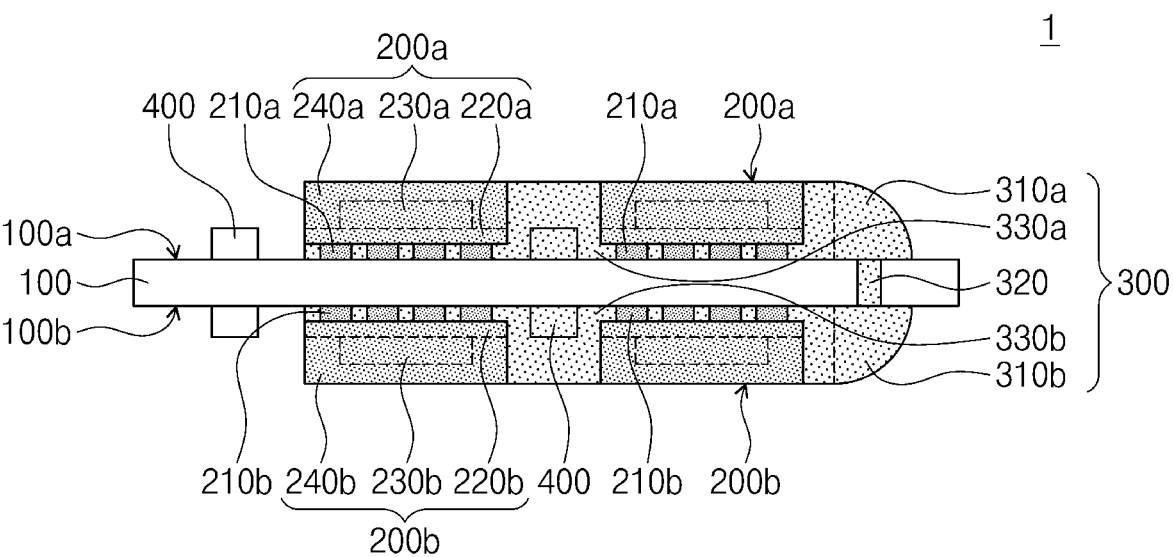
FIG. 16 illustrates a cross-sectional view seen from the second side of the semiconductor module depicted in FIG. 10A according to some embodiments of the present inventive concepts.

FIG. 16 illustrates a cross-sectional view seen from the second side of the semiconductor module depicted in FIG. 10A according to some embodiments of the present inventive concepts. The following semiconductor module is similar to that discussed with reference to FIGS. 1A, 14, and 15, and thus the major differences between the semiconductor modules will be described below in the interest of brevity of description.

Referring to FIGS. 10A and 16, the clip structure 300 may include an upper body part 300*a* and 330*a* disposed on the top surface 100*a* of the module substrate 100, a lower body part 300*b* and 330*b* disposed on the bottom surface 100*b* of the module substrate 100, and a connection part 320 that extends from the upper body part 300*a* and 330*a* across the lateral surface 100*c* of the module substrate 100 to the lower body part 300*b* and 330*b*. The upper body part 300*a* and 330*a* and the lower body part 300*b* and 330*b* may each be configured substantially identical to the body part 310 and 330 discussed with reference to FIGS. 10A, 10B, 10C, and 11.

For example, the upper body part 300*a* and 330*a* may include a first upper body part 300*a* disposed between an outermost one of the upper semiconductor packages 200*a* and the third side 100S3 of the module substrate 100, and a second upper body part 330*a* that is disposed adjacent to the second side 100S2 of the module substrate 100 and extends in the first direction D1 at one side of the upper semiconductor packages 200*a*. Among the upper semiconductor packages 200*a*, the outermost upper semiconductor package 200*a* may be an upper semiconductor package that is most adjacent to the third side 100S3 of the module substrate 100. The first upper body part 300*a* may have a bar shape that extends in the second direction D2 between the outermost upper semiconductor package 200*a* and the third side 100S3 of the module substrate 100. The second upper body part

330*a* may have a bar shape that extends in the first direction D1 at one side of the upper semiconductor packages 200*a*. The first upper body part 300*a* and the second upper body part 330*a* may be connected to each other on the top surface 100*a* of the module substrate 100, and may constitute an L shape when viewed in plan.

The lower body part 300*b* and 330*b* may be configured substantially identical to the upper body part 300*a* and 330*a*. The lower body part 300*b* and 330*b* may have a shape symmetrical to that of the upper body part 300*a* and 330*a*. For example, the lower body part 300*b* and 330*b* may include a first lower body part 300*b* disposed between an outermost one of the lower semiconductor packages 200*b* and the third side 100S3 of the module substrate 100, and a second lower body part 330*b* that is disposed adjacent to the second side 100S2 of the module substrate 100 and extends in the first direction D1 at one side of the lower semiconductor packages 200*b*. Among the lower semiconductor packages 200*b*, the outermost lower semiconductor package 200*b* may be a lower semiconductor package that is most adjacent to the third side 100S3 of the module substrate 100. The first lower body part 300*b* may have a bar shape that extends in the second direction D2 between the outermost lower semiconductor package 200*b* and the third side 100S3 of the module substrate 100. The second lower body part 330*b* may have a bar shape that extends in the first direction D1 at one side of the lower semiconductor packages 200*b*. The first lower body part 300*b* and the second lower body part 330*b* may be connected to each other on the bottom surface 100*b* of the module substrate 100, and may constitute an L shape when viewed in plan.

As discussed with reference to FIG. 15, the connection part 320 may include a first portion P1 that extends from a sidewall of the first upper body part 300*a* onto the top surface 100*a* of the module substrate 100, a second portion P2 that extends from the first portion P1 onto the lateral surface 100*c* of the module substrate 100, and a third portion P3 that extends from the second portion P2 onto the bottom surface 100*b* of the module substrate 100. The first, second, and third portions P1, P2, and P3 may be connected to each other and may constitute the connection part 320. The module substrate 100 may be inserted into between the first and third portions P1 and P3 of the connection part 320, and accordingly, the clip structure 300 may be physically attached to the module substrate 100.

Figure 17:
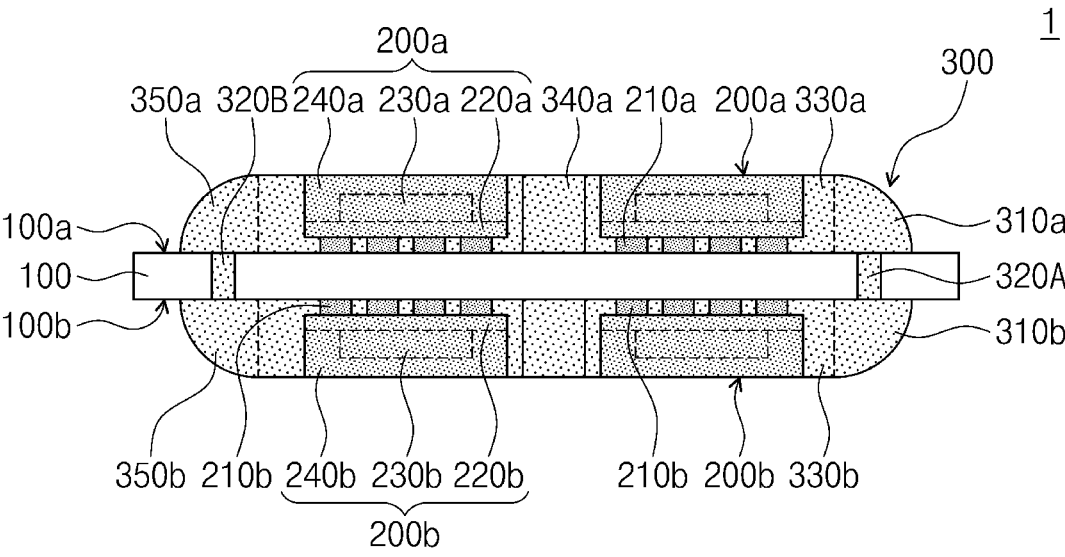
FIG. 17 illustrates a cross-sectional view seen from the second side of the semiconductor module depicted in FIG. 12A according to some embodiments of the present inventive concepts.

FIG. 17 illustrates a cross-sectional view seen from the second side of the semiconductor module depicted in FIG. 12A according to some embodiments of the present inventive concepts. The following semiconductor module is similar to that discussed with reference to FIGS. 1A, 14, and 15, and thus the major differences between the semiconductor modules will be described below in the interest of brevity of description.

Referring to FIGS. 12A and 17, the clip structure 300 may include an upper body part 300*a*, 330*a*, 340*a*, and 350*a* disposed on the top surface 100*a* of the module substrate 100, a lower body part 300*b*, 330*b*, 340*b*, and 350*b* disposed on the bottom surface 100*b* of the module substrate 100, and a connection part 320A and 320B that extends from the upper body part 300*a*, 330*a*, 340*a*, and 350*a* across the lateral surface 100*c* of the module substrate 100 to the lower body part 300*b*, 330*b*, 340*b*, and 350*b*. The upper body part 300*a*, 330*a*, 340*a*, and 350*a* and the lower body part 300*b*, 330*b*, 340*b*, and 350*b* may each be configured substantially identical to the body part 310, 330, 340, and 350 discussed with reference to FIGS. 12A, 12B, 12C, and 13.

For example, the upper body part 300a, 330a, 340a, and 350a may include a first upper body part 300a disposed between a first outermost one of the upper semiconductor packages 200a and the third side 100S3 of the module substrate 100, a second upper body part 330a that is disposed adjacent to the second side 100S2 of the module substrate 100 and extends in the first direction D1 at one side of the upper semiconductor packages 200a, a third upper body part 350a disposed between a second outermost one of the upper semiconductor packages 200a and the fourth side 100S4 of the module substrate 100, and a fourth upper body part 340a disposed between the upper semiconductor packages 200a. Among the upper semiconductor packages 200a, the first outermost upper semiconductor package 200a may be an upper semiconductor package that is most adjacent to the third side 100S3 of the module substrate 100, and the second outermost upper semiconductor package 200a may be an upper semiconductor package that is most adjacent to the fourth side 100S4 of the module substrate 100. The first upper body part 300a may have a bar shape that extends in the second direction D2 between the first outermost upper semiconductor package 200a and the third side 100S3 of the module substrate 100. The second upper body part 330a may have a bar shape that extends in the first direction D1 at one side of the upper semiconductor packages 200a. The third upper body part 350a may have a bar shape that extends in the second direction D2 between the second outermost upper semiconductor package 200a and the fourth side 100S4 of the module substrate 100. The fourth upper body part 340a may have a bar shape that extends in the second direction D2 between the upper semiconductor packages 200a. The first, second, third, and fourth body parts 300a, 330a, 350a, and 340a may be connected to each other on the top surface 100a of the module substrate 100, and may constitute an E shape when viewed in plan.

The lower body part 300b, 330b, 340b, and 350b may be configured substantially identical to the upper body part 300a, 330a, 340a, and 350a. The lower body part 300b, 330b, 340b, and 350b may have a shape symmetrical to that of the upper body part 300a, 330a, 340a, and 350a. For example, the lower body part 300b, 330b, 340b, and 350b may include a first lower body part 300b disposed between a first outermost one of the lower semiconductor packages 200b and the third side 100S3 of the module substrate 100, a second lower body part 330b that is disposed adjacent to the second side 100S2 of the module substrate 100 and extends in the first direction D1 at one side of the lower semiconductor packages 200b, a third lower body part 350b disposed between a second outermost one of the lower semiconductor packages 200b and the fourth side 100S4 of the module substrate 100, and a fourth lower body part 340b disposed between the lower semiconductor packages 200b. Among the lower semiconductor packages 200b, the first outermost lower semiconductor package 200b may be a lower semiconductor package that is most adjacent to the third side 100S3 of the module substrate 100, and the second outermost lower semiconductor package 200b may be a lower semiconductor package that is most adjacent to the fourth side 100S4 of the module substrate 100. The first lower body part 300b may have a bar shape that extends in the second direction D2 between the first outermost lower semiconductor package 200b and the third side 100S3 of the module substrate 100. The second lower body part 330b may have a bar shape that extends in the first direction D1 at one side of the lower semiconductor packages 200b. The third lower body part 350b may have a bar shape that extends in the second direction D2 between the second outermost lower semiconductor package 200b and the fourth side 100S4 of the module substrate 100. The fourth lower body part 340b may have a bar shape that extends in the second direction D2 between the lower semiconductor packages 200b. The first, second, third, and fourth lower body parts 300b, 330b, 350b, and 340b may be connected to each other on the bottom surface 100b of the module substrate 100, and may constitute an E shape when viewed in plan.

The connection part 320A and 320B may include a first connection part 320A that extends from the first upper body part 300a across the lateral surface 100c of the module substrate 100 to the first lower body part 300b, and a second connection part 320B that extends from the third upper body part 350a across the lateral surface 100c of the module substrate 100 to the third lower body part 350b. The first connection part 320A and the second connection part 320B may each be configured substantially the same as the connection part 320 discussed with reference to FIG. 15.

Figures 18A, 18B, 18C:
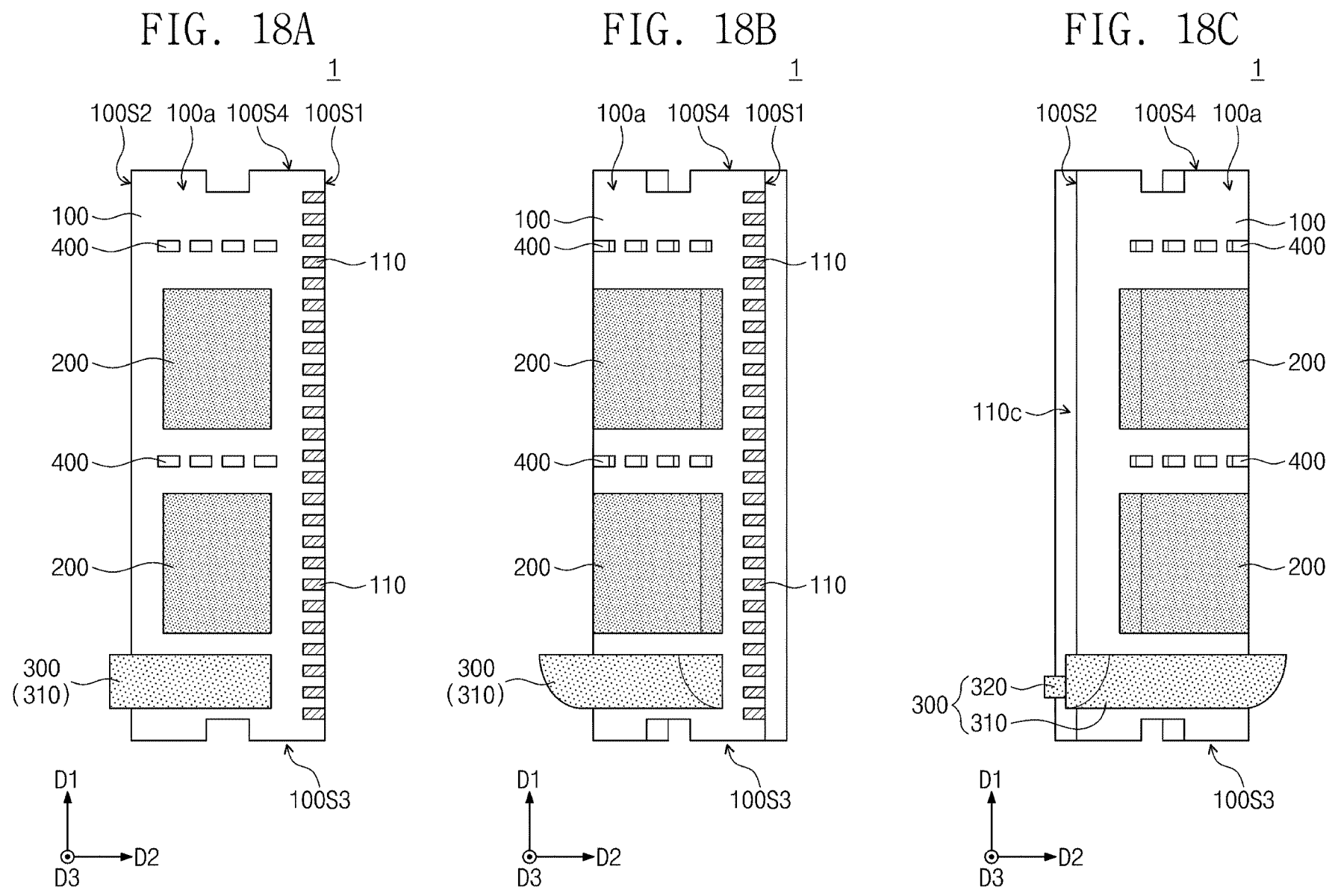
Figure 19:
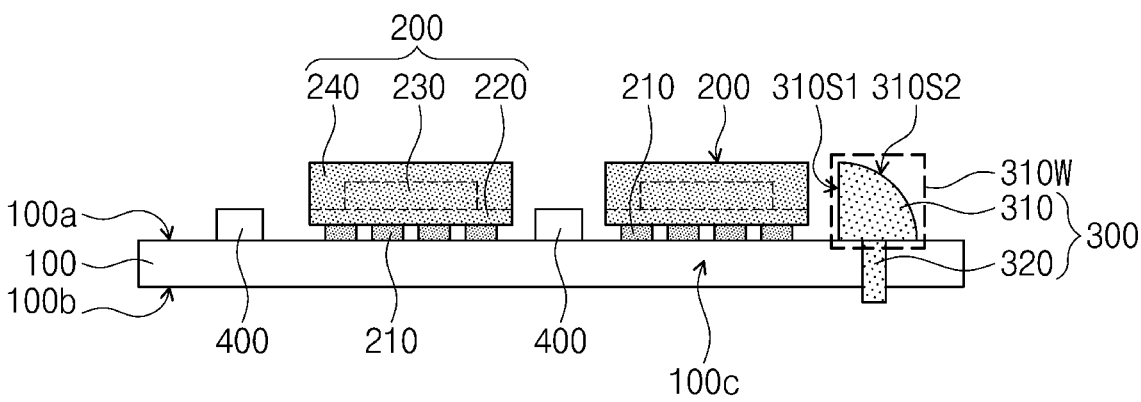
FIG. 19 illustrates a cross-sectional view seen from the second side of the semiconductor module depicted in FIG. 18A.
Figure 20:
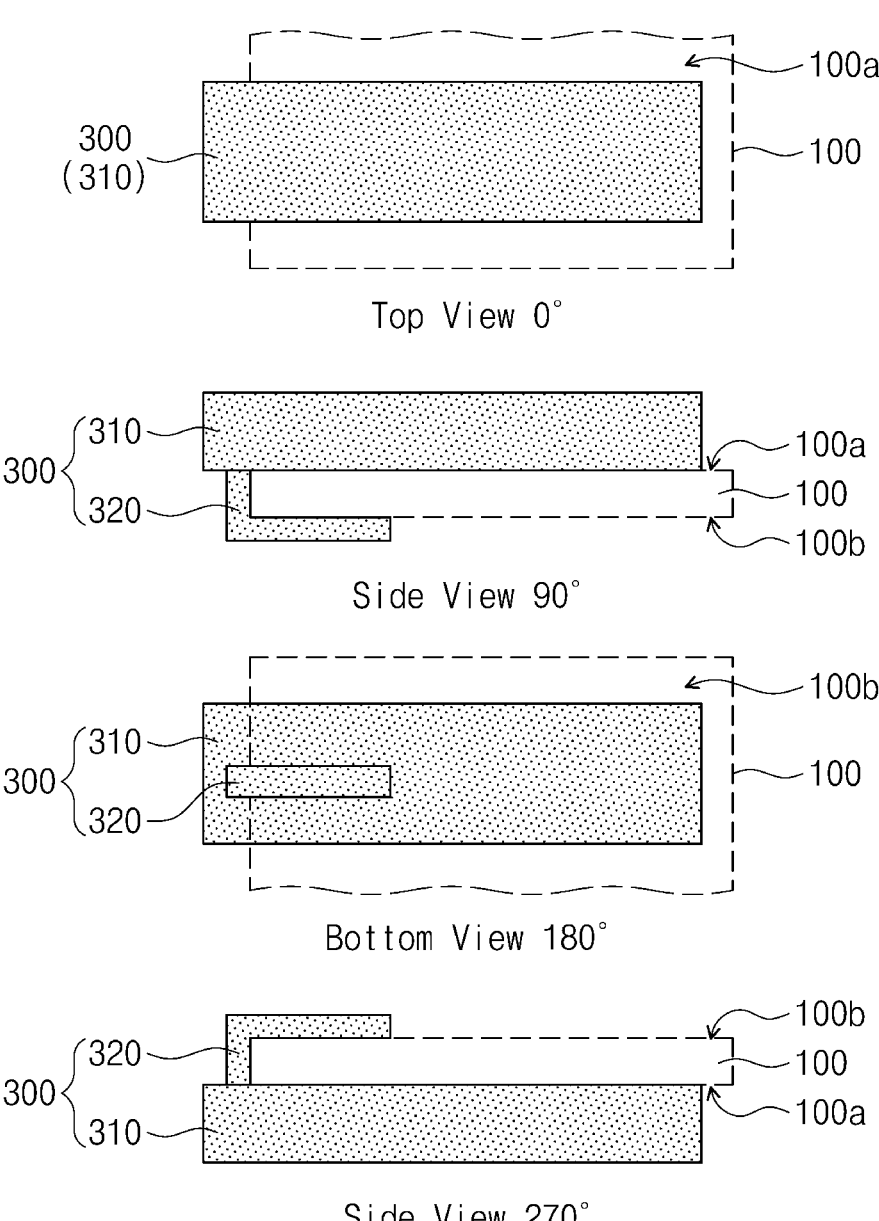
FIG. 20 illustrates diagrams in accordance with a rotation angle of a clip structure depicted in FIG. 18A.

FIG. 18A illustrates a plan view showing a semiconductor module according to some embodiments of the present inventive concepts. FIG. 18B illustrates a perspective view showing a first side of the semiconductor module depicted in FIG. 18A. FIG. 18C illustrates a perspective view showing a second side of the semiconductor module depicted in FIG. 18A. FIG. 19 illustrates a cross-sectional view seen from the second side of the semiconductor module depicted in FIG. 18A. FIG. 20 illustrates diagrams in accordance with a rotation angle of a clip structure depicted in FIG. 18A. In the embodiment that follows, differences from the semiconductor module described with reference to FIGS. 1A, 1B, 1C, 2, and 3 will be mainly discussed herein in the interest of brevity.

Referring to FIGS. 18A, 18B, 18C, 19, and 20, the body part 310 of the clip structure 300 may have a pillar shape that extends in the second direction D2 between the outermost semiconductor package 200 and the third side 100S3 of the module substrate 100. When viewed from the second side 100S2 of the module substrate 100, as illustrated in FIG. 19, the body part 310 may have a half-streamline sidewall 310W. In addition, when viewed from the second side 100S2 of the module substrate 100, as illustrated in FIG. 18B, the body part 310 may have a half-streamline sidewall 310W.

The connection part 320 may extend from a bottom surface of the body part 310 across the lateral surface 100c of the module substrate 100 onto the bottom surface 100b of the module substrate 100. The module substrate 100 may be inserted into between the bottom surface of the body part 310 and a portion of the connection part 320 on the bottom surface 100b of the module substrate 100, and thus the clip structure 300 may be physically attached to the module substrate 100.

According to the present inventive concepts, a clip structure may change a flow of vapor produced in two-phase immersion cooling. Therefore, the vapor whose thermal conductivity is relatively low may be suppressed from being trapped between a module substrate and each of a plurality of semiconductor packages. As a result, heat may be easily transferred from the plurality of semiconductor packages to a coolant used in the two-phase immersion cooling, and therefore a semiconductor module may increase in reliability.

It may thus be possible to provide a semiconductor module capable of preventing vapor from being trapped in two-phase immersion cooling and achieving easy heat transfer, and to increase reliability of the semiconductor module.

The aforementioned description provides some embodiments for explaining the present inventive concepts. Therefore, the present inventive concepts are not limited to the embodiments described above, and it will be understood by one of ordinary skill in the art that variations in form and detail may be made therein without departing from the spirit and features of the present inventive concepts.

What is claimed is:

1. A semiconductor module, comprising:
a module substrate having a top surface and a bottom surface that are opposite to each other;
a plurality of semiconductor packages on the top surface of the module substrate and arranged in a first direction parallel to the top surface of the module substrate;
a clip structure on the top surface of the module substrate and spaced apart from the plurality of semiconductor packages in the first direction, and
a plurality of tabs on the top surface of the module substrate and arranged in the first direction at a first side of the module substrate,
wherein the plurality of tabs are spaced apart in a second direction from the plurality of semiconductor packages and the clip structure,
wherein the second direction is parallel to the top surface of the module substrate and intersects the first direction,
wherein the clip structure comprises:
a body part on the top surface of the module substrate and spaced apart from the plurality of semiconductor packages in the first direction; and
a connection part that extends from the body part across a lateral surface of the module substrate onto the bottom surface of the module substrate.

2. The semiconductor module of claim 1,
wherein the connection part of the clip structure is adjacent to a second side of the module substrate, and
wherein the first side and the second side of the module substrate are opposite to each other.

3. The semiconductor module of claim 1, further comprising:
a plurality of semiconductor elements on the top surface of the module substrate,
wherein the clip structure is spaced apart from the plurality of semiconductor elements in the first direction.

4. The semiconductor module of claim 1, wherein respective ones of the plurality of semiconductor packages comprises:
a package substrate;
a semiconductor chip on the package substrate; and
a molding layer on the package substrate,
wherein the molding layer is on the semiconductor chip.

5. The semiconductor module of claim 1, wherein the clip structure is electrically isolated from the plurality of semiconductor packages.

6. The semiconductor module of claim 1, wherein the body part of the clip structure has a bar shape that extends in the second direction at one side of an outermost one of the plurality of semiconductor packages.

7. The semiconductor module of claim 6, wherein the body part comprises:
a first lateral surface that faces the outermost one of the plurality of semiconductor packages; and
a second lateral surface opposite to the first lateral surface,
wherein the second lateral surface of the body part has a curved surface, an angled surface, or a plate shape that is inclined relative to the top surface of the module substrate.

8. The semiconductor module of claim 1, wherein the module substrate comprises:

the first side and a second side that extend in the first direction and are opposite to each other; and
a third side and a fourth side that extend in the second direction and are opposite to each other,
wherein the body part of the clip structure comprises:
a first body part that extends in the second direction between a first outermost one of the plurality of semiconductor packages and the third side of the module substrate; and
a second body part that extends in the first direction at one side of the plurality of semiconductor packages,
wherein the first body part and the second body part are connected to each other on the top surface of the module substrate in an L shape.

9. The semiconductor module of claim 8, wherein the body part of the clip structure further comprises:
a third body part that extends in the second direction between a second outermost one of the plurality of semiconductor packages and the fourth side of the module substrate; and
a fourth body part that extends in the second direction between the plurality of semiconductor packages,
wherein the first body part, the second body part, the third body part, and the fourth body part are connected to each other on the top surface of the module substrate in an E shape.

10. The semiconductor module of claim 1,
wherein the plurality of semiconductor packages on the top surface of the module substrate are upper semiconductor packages,
wherein the body part on the top surface of the module substrate is an upper body part,
wherein the semiconductor module further comprises a plurality of lower semiconductor packages on the bottom surface of the module substrate,
wherein the clip structure further comprises a lower body part on the bottom surface of the module substrate and spaced apart from the lower semiconductor packages in the first direction, and
wherein the connection part extends from the upper body part to the lower body part.

11. A semiconductor module, comprising:
a module substrate having a top surface and a bottom surface that are opposite to each other, the module substrate comprising:
a first side and a second side that extend in a first direction and are opposite to each other, and
a third side and a fourth side that extend in a second direction and are opposite to each other, wherein the first direction and the second direction are parallel to the top surface of the module substrate and intersect each other;
a plurality of semiconductor packages on the top surface of the module substrate and arranged in the first direction;
a plurality of tabs on the top surface of the module substrate, adjacent to the first side, and arranged in the first direction; and
a clip structure on the top surface of the module substrate and spaced apart from the plurality of semiconductor packages and the plurality of tabs in the first direction,
wherein the plurality of tabs are spaced apart in the second direction from the plurality of semiconductor packages and the clip structure,
wherein the clip structure comprises:
a body part on the top surface of the module substrate, the body part extending in the second direction between an outermost one of the plurality of semi-conductor packages and the third side of the module substrate; and a connection part adjacent to the second side of the module substrate, the connection part extending from the body part across a lateral surface of the module substrate onto the bottom surface of the module substrate.

12. The semiconductor module of claim 11, wherein the body part comprises:

a first lateral surface that faces the outermost one of the plurality of semiconductor packages; and a second lateral surface opposite to the first lateral surface, wherein the second lateral surface of the body part has a curved surface, an angled surface, or a plate shape that is inclined relative to the top surface of the module substrate.

13. The semiconductor module of claim 12, wherein the second lateral surface of the body part comprises a plurality of curved surfaces that are different from each other.

14. The semiconductor module of claim 11, wherein, when viewed from the second side of the module substrate, the body part has a half-streamline shaped sidewall, a half-dolphin shaped sidewall, a rectangular sidewall, or a triangular sidewall.

15. The semiconductor module of claim 11, wherein the body part comprises a first body part, wherein the clip structure further comprises a second body part on the top surface of the module substrate and adjacent to the second side of the module substrate, the second body part extending in the first direction at one side of the plurality of semiconductor packages, and wherein the first body part and the second body part are connected to each other on the top surface of the module substrate in an L shape in plan view.

16. The semiconductor module of claim 15, wherein the outermost one of the plurality of semicon-ductor packages is a first outermost semiconductor package, wherein the clip structure further comprises:

a third body part on the top surface of the module substrate, the third body part extending in the second direction between a second outermost one of the plurality of semiconductor packages and the fourth side of the module substrate; and a fourth body part that extends in the second direction between the plurality of semiconductor packages, and wherein the first body part, the second body part, the third body part, and the fourth body part are connected to each other on the top surface of the module substrate in an E shape in plan view.

17. The semiconductor module of claim 11, wherein the clip structure comprises a non-conductive material or is electrically isolated from the plurality of semiconductor packages.

18. A semiconductor module, comprising:

a module substrate having a top surface and a bottom surface that are opposite to each other;

a plurality of semiconductor packages on the top surface of the module substrate; and a clip structure on the top surface of the module substrate and spaced apart from the plurality of semiconductor packages in a first direction, wherein the clip structure comprises:

a body part on the top surface of the module substrate and spaced apart from the plurality of semiconductor packages in the first direction; and a connection part that extends from the body part onto the bottom surface of the module substrate and is in direct contact with a lateral surface of the module substrate, wherein the lateral surface of the module substrate is on an outer edge of the clip structure in a second direction that intersects the first direction, and wherein the body part comprises a curved surface remote from the plurality of semiconductor packages.

\* \* \* \* \*